(12) United States Patent
Sharangpani et al.

(10) Patent No.: US 12,356,627 B2
(45) Date of Patent: Jul. 8, 2025

(54) MEMORY DEVICE CONTAINING COMPOSITION-CONTROLLED FERROELECTRIC MEMORY ELEMENTS AND METHOD OF MAKING THE SAME

(71) Applicant: SANDISK TECHNOLOGIES LLC, Addison, TX (US)

(72) Inventors: Rahul Sharangpani, Fremont, CA (US); Kartik Sondhi, Milpitas, CA (US); Raghuveer S. Makala, Campbell, CA (US); Tiffany Santos, Palo Alto, CA (US); Fei Zhou, San Jose, CA (US); Joyeeta Nag, San Jose, CA (US); Bhagwati Prasad, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 432 days.

(21) Appl. No.: 17/821,012

(22) Filed: Aug. 19, 2022

(65) Prior Publication Data
US 2024/0064992 A1    Feb. 22, 2024

(51) Int. Cl.
H10D 30/01    (2025.01)
H10B 51/10    (2023.01)
H10B 51/20    (2023.01)
H10D 30/69    (2025.01)

(52) U.S. Cl.
CPC ............. *H10B 51/20* (2023.02); *H10B 51/10* (2023.02); *H10D 30/0415* (2025.01); *H10D 30/701* (2025.01)

(58) Field of Classification Search
CPC ..... H10B 51/20; H10B 51/10; H01L 29/6684; H01L 29/78391; H01L 29/40111; H01L 29/516
See application file for complete search history.

(56) References Cited

U.S. PATENT DOCUMENTS

| | | |
|---|---|---|
| 5,915,167 A | 6/1999 | Leedy |
| 10,700,093 B1 | 6/2020 | Kalitsov et al. |
| 10,937,809 B1 | 3/2021 | Sharangpani et al. |
| 10,957,711 B2 | 3/2021 | Prasad et al. |
| 11,024,648 B2 | 6/2021 | Sharangpani et al. |

(Continued)

OTHER PUBLICATIONS

Cabout, T. et al., "Role of Ti and Pt electrodes on resistance switching variability of HfO2-based Resistive Random Access Memory," Thin Solid Films, vol. 533, pp. 19-23 (2013); http://dx.doi.org/10.1016/j.tsf.2012.11.050.

(Continued)

*Primary Examiner* — Shih Tsun A Chou
*Assistant Examiner* — Jonathan Keith Little
(74) *Attorney, Agent, or Firm* — THE MARBURY LAW GROUP PLLC

(57) ABSTRACT

A semiconductor memory device includes an alternating stack of insulating layers and electrically conductive layers, a memory opening vertically extending through the alternating stack, and a memory opening fill structure located in the memory opening and including a vertical stack of discrete ferroelectric material portions and a vertical semiconductor channel. In one embodiment, the discrete ferroelectric material portions include a ferroelectric alloy material of a first dielectric metal oxide material and a second dielectric metal oxide material. In another embodiment, each of the discrete ferroelectric material portions is oxygen-deficient.

22 Claims, 38 Drawing Sheets

(56) References Cited

U.S. PATENT DOCUMENTS

| | | | |
|---|---|---|---|
| 11,049,880 | B2 | 6/2021 | Rajashekhar et al. |
| 11,107,516 | B1 | 8/2021 | Rabkin et al. |
| 11,177,284 | B2 | 11/2021 | Rabkin et al. |
| 11,239,254 | B2 | 2/2022 | Sharangpani et al. |
| 11,271,009 | B2 | 3/2022 | Kalitsov et al. |
| 11,309,332 | B2 | 4/2022 | Rajashekhar et al. |
| 2015/0214322 | A1* | 7/2015 | Mueller ............... H01L 29/516 257/532 |
| 2020/0203381 | A1 | 6/2020 | Rabkin et al. |
| 2021/0066348 | A1* | 3/2021 | Prasad ............. H01L 21/02189 |
| 2021/0074727 | A1 | 3/2021 | Prasad et al. |
| 2021/0082955 | A1 | 3/2021 | Rajashekhar et al. |
| 2022/0139960 | A1 | 5/2022 | Said et al. |
| 2022/0157852 | A1 | 5/2022 | Prasad et al. |
| 2022/0157966 | A1 | 5/2022 | Prasad et al. |
| 2022/0189993 | A1 | 6/2022 | Tirukkonda et al. |
| 2022/0231048 | A1 | 7/2022 | Sharangpani et al. |

OTHER PUBLICATIONS

Cho, E. et al., "Electronic structure of Pt/HfO2 interface with oxygen vacancy," Microelectronic Engineering, vol. 88, pp. 3407-3410 (2011).

Lee, C.K. et al., "First-principles study on doping and phase stability of HfO2," Physical Review B, vol. 78, pp. 012102-1 to 012102-4 (2008); DOI: 10.1103/PhysRevB.78.012102.

O'Hara, A. et al., "Assessing hafnium on hafnia as an oxygen getter," Journal of Applied Physics., vol. 115, pp. 183703-1 to 183703-8 (2014); https://doi.org/10.1063/1.4876262.

Pal, A. et al., "Enhancing ferroelectricity in dopant-free hafnium oxide," Applied Physics Letters, vol. 110, pp. 022903-01 to 022903-04 (2017); https://doi.org/10.1063/1.4973928.

Peng, Y. et al., "Ferroelectric-like Behavior Originating from Oxygen Vacancy Dipoles in Amorphous Film for Non-volatile Memory," Nanoscale Research Letters, vol. 15, No. 134, pp. 1-6 (2020); https:/doi.org/10.1186/s11671-020-03364-3.

Pesic, M. et al., "Physical Mechanisms behind the Field-Cycling Behavior of HfO2-Based Ferroelectric Capacitors," Advanced Functional Materials, DOI: 10.1002/adfm.201600590.

Sondhi, K. et al., "Memory Device Containing Composition-Controlled Ferroelectric Memory Elements and Method of Making the Same," U.S. Appl. No. 17/820,997, filed Aug. 19, 2022.

Young-Fisher, K. G. et al., "Leakage Current-Forming Voltage Relation and Oxygen Gettering in HfOx RRAM Devices," IEEE Electronic Device Letters, vol. 34, No. 6, pp. 750-752 (2013).

Zhang, H. et al., "Ionic doping effect in resistive switching memory," Applied Physics Letters, vol. 96, pp. 123502-01 to 123502-3 (2010); https://doi.org/10.1063/1.3364130.

Hoffmann, M. et al., "Atomic layer etching of ferroelectric hafnium zirconium oxide thin films enables giant tunneling electroresistance." Applied Physics Letters 120.12 (2022): 122901. https://doi.org/10.1063/5.0084636.

Lee, D. et al., "Domains and domain dynamics in fluorite-structured ferroelectrics." Applied Physics Reviews 8.2 (2021): 021312. DOI:10.1063/5.0047977.

Lee, Y. et al., "Thermal atomic layer etching of Al2O3, HfO2, and ZrO2 using sequential hydrogen fluoride and dimethylaluminum chloride exposures." The Journal of Physical Chemistry C 123.30 (2019): 18455-18466. https://doi.org/10.1021/acs.jpcc.9b04767.

Liu, H. et al. "$ZrO_2$ Ferroelectric Field-Effect Transistors Enabled by the Switchable Oxygen Vacancy Dipoles", Nanoscale Research Letters May 24, 2020;15(1):120. doi: 10.1186/s11671-020-03353-6.

Liao, J. et al., "Grain size engineering of ferroelectric Zr-doped HfO 2 for the highly scaled devices applications." IEEE Electron Device Letters 40.11 (2019): 1868-1871. DOI: 10.1109/LED.2019.2944491.

Mukundan, V. et al., "Ferroelectric Phase Content in 7 nm Hf(1−x)ZrxO2 Thin Films Determined by X-Ray-Based Methods." physica status solidi (a) 218.10 (2021): 2100024. https://doi.org/10.1002/pssa.202100024.

Shin, D. et al., "Thermodynamic modeling of the Hf—Si—O system." Calphad 30.4 (2006): 375-386. https://doi.org/10.1016/l.calphad.2006.08.008.

Xiao, W. et al., "Memory window and endurance improvement of Hf 0.5 Zr 0.5 O 2-based FeFETs with ZrO 2 seed layers characterized by fast voltage pulse measurements." Nanoscale research letters 14.1 (2019): 1-7. DOI:10.1186/s11671-019-3063-2.

U.S. Appl. No. 17/809,758, filed Jun. 29, 2022, SanDisk Technologies LLC.

Mulaosmanovic, H. et al., "Evidence of single domain switching in hafnium oxide based FeFETs: Enabler for multi-level FeFET memory cells," 2015 IEEE International Electron Devices Meeting (IEDM), 2015, pp. 26.8.1-26.8.3, doi: 10.1109/IEDM.2015.7409777.

USPTO Office Communication, Non-Final Office Action for U.S. Appl. No. 17/820,997, mailed on Feb. 18, 2025, 25 pages.

* cited by examiner

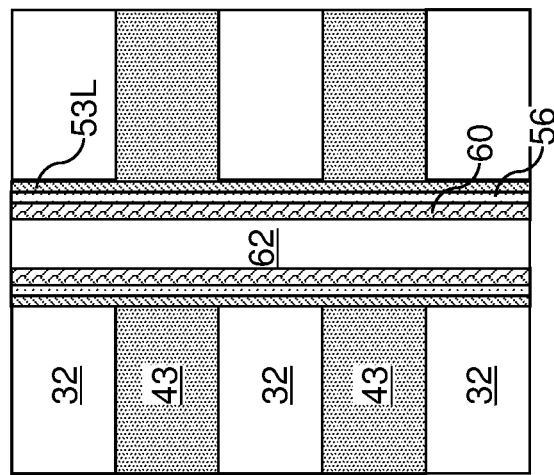
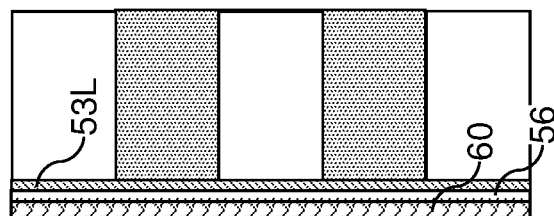
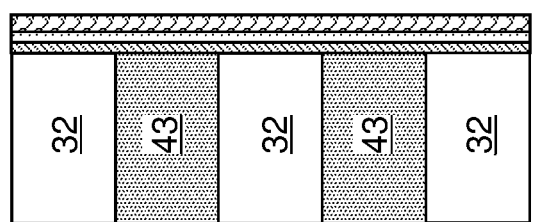
FIG. 7C
FIG. 7B
FIG. 7A

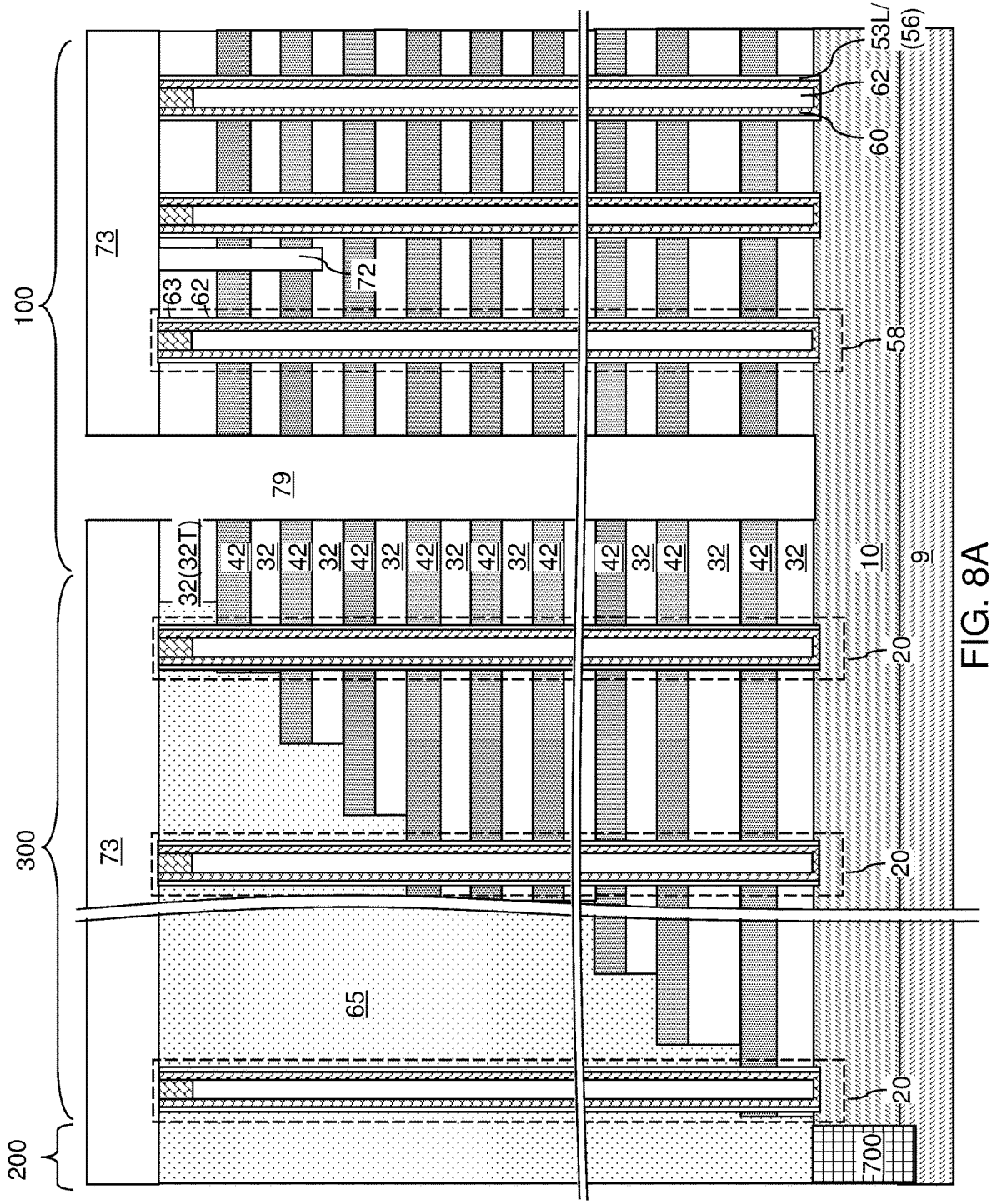

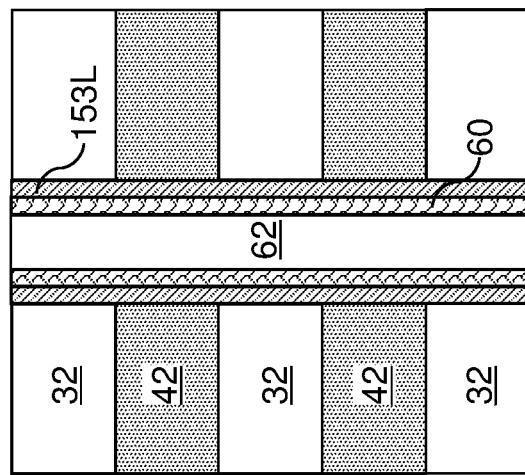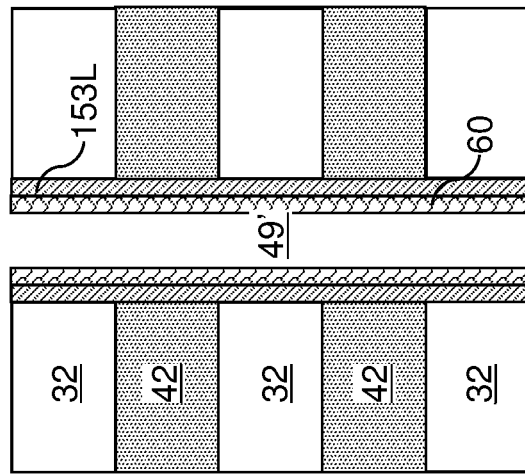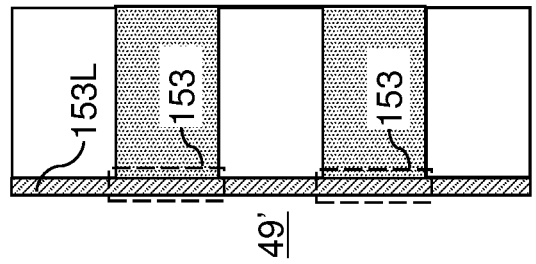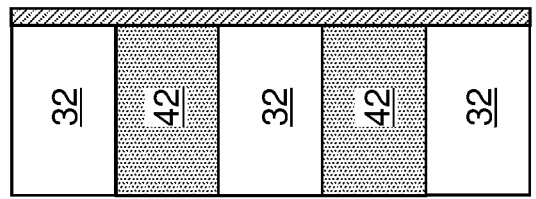

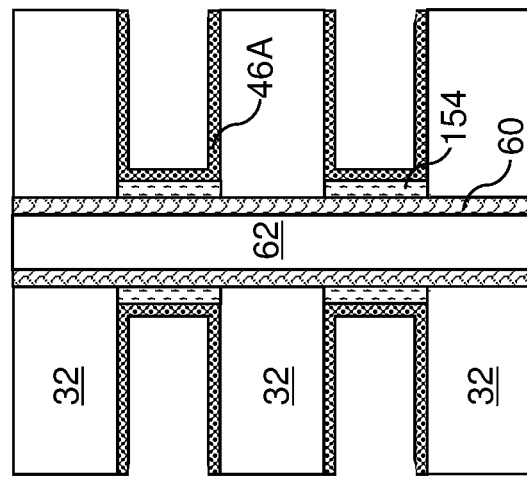
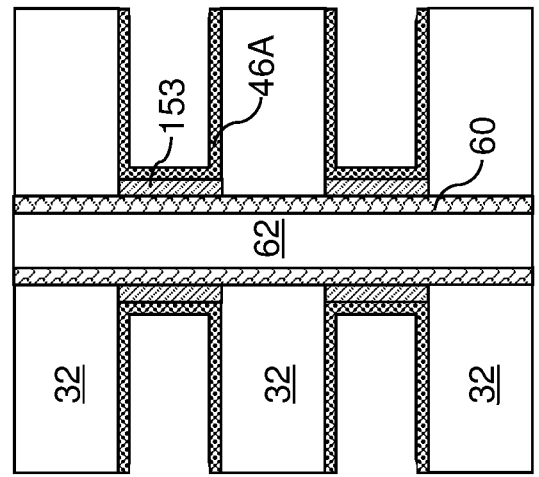
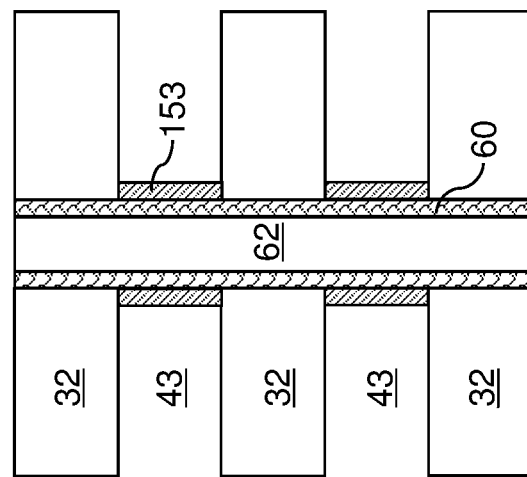

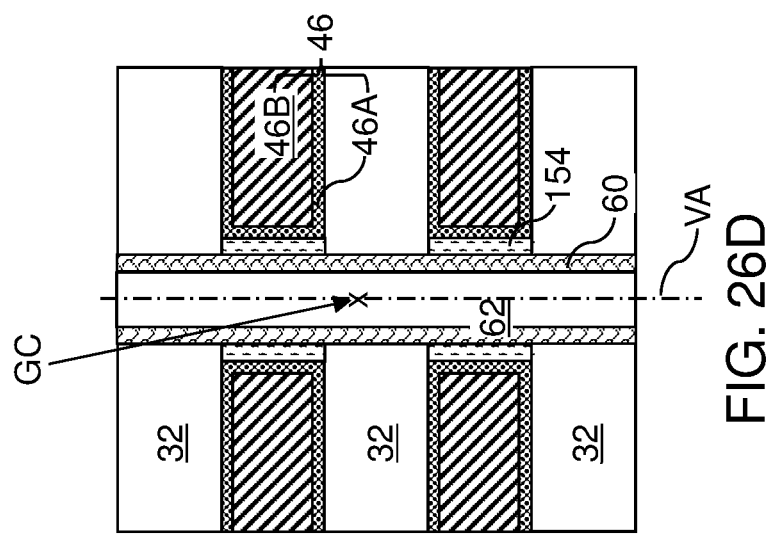

MEMORY DEVICE CONTAINING COMPOSITION-CONTROLLED FERROELECTRIC MEMORY ELEMENTS AND METHOD OF MAKING THE SAME

FIELD

The present disclosure relates generally to the field of semiconductor devices, and particular to three-dimensional memory devices containing composition-controlled ferroelectric memory elements and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remanent polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a semiconductor memory device is provided, which comprises: an alternating stack of insulating layers and electrically conductive layers; a memory opening vertically extending through the alternating stack; and a memory opening fill structure located in the memory opening and comprising a vertical semiconductor channel and a vertical stack of discrete ferroelectric material portions located at levels of the electrically conductive layers and comprising a ferroelectric alloy material of a first dielectric metal oxide material and a second dielectric metal oxide material; and a vertical stack of discrete dielectric material portions comprising the first dielectric metal oxide material and vertically interlaced with the vertical stack of discrete ferroelectric material portions.

According to another aspect of the present disclosure, a method of forming a semiconductor structure comprises: forming an alternating stack of insulating layers and sacrificial material layers over a substrate; forming a memory opening through the alternating stack; forming an in-process memory opening fill structure in the memory opening, wherein the in-process memory opening fill structure comprises a first dielectric metal oxide layer comprising a first dielectric metal oxide material and a vertical semiconductor channel that is formed over the first dielectric metal oxide layer; forming backside recesses by removing the sacrificial material layers selective to the insulating layers, wherein outer surface segments of the first dielectric metal oxide layer are physically exposed to the backside recesses; forming a vertical stack of discrete ferroelectric material portions by depositing a second dielectric metal oxide layer comprising a second dielectric metal oxide material in the backside recesses and alloying the second dielectric metal oxide material and the first dielectric metal oxide material at interfaces between the first dielectric metal oxide layer and the second dielectric metal oxide layer; and forming electrically conductive layers in remaining volumes of the backside recesses around the vertical stack of discrete ferroelectric material portions.

According to yet another aspect of the present disclosure, a semiconductor memory device is provided, which comprises: an alternating stack of insulating layers and electrically conductive layers; a memory opening vertically extending through the alternating stack; and a memory opening fill structure located in the memory opening and comprising a vertical stack of discrete non-stoichiometric oxygen-deficient ferroelectric material portions and a vertical semiconductor channel, wherein: the discrete non-stoichiometric oxygen-deficient ferroelectric material portions are vertically spaced apart from each other; and each of the discrete non-stoichiometric oxygen-deficient ferroelectric material portions is in direct contact with a sidewall of a respective oxygen-gettering liner.

According to still another aspect of the present disclosure, a method of forming a semiconductor structure comprises: forming an alternating stack of insulating layers and sacrificial material layers over a substrate; forming a memory opening through the alternating stack; forming an in-process memory opening fill structure in the memory opening, wherein the in-process memory opening fill structure comprises metal oxide tubular portions located at levels of the sacrificial material layers and a vertical semiconductor channel that is formed over the metal oxide tubular portions; forming backside recesses by removing the sacrificial material layers selective to the insulating layers and the metal oxide tubular portions; forming an oxygen-gettering liner in each of the backside recesses and directly on an outer sidewall of a respective one of the metal oxide tubular portions; and gettering oxygen atoms from the metal oxide tubular portions to convert them into a vertical stack of discrete non-stoichiometric oxygen-deficient ferroelectric material portions.

BRIEF DESCRIPTION OF THE DRAWINGS

FIGS. 7A-7C are sequential schematic vertical cross-sectional views of a memory opening within the first exemplary structure during formation of a second exemplary in-process memory opening fill structure according to the first embodiment of the present disclosure.

FIG. 8A is a schematic vertical cross-sectional view of the first exemplary structure after formation of a contact-level dielectric layer backside trenches according to the first embodiment of the present disclosure.

FIGS. 18A-18C are sequential vertical cross-sectional views of a region of a second exemplary structure during formation of an in-process memory opening fill structure according to a second embodiment of the present disclosure.

FIGS. 26A-26D are sequential vertical cross-sectional views of a region of the third exemplary structure during conversion of an in-process memory opening fill structure into a memory opening fill structure and formation of electrically conductive layers according to the third embodiment of the present disclosure.

DETAILED DESCRIPTION

Figure 1:
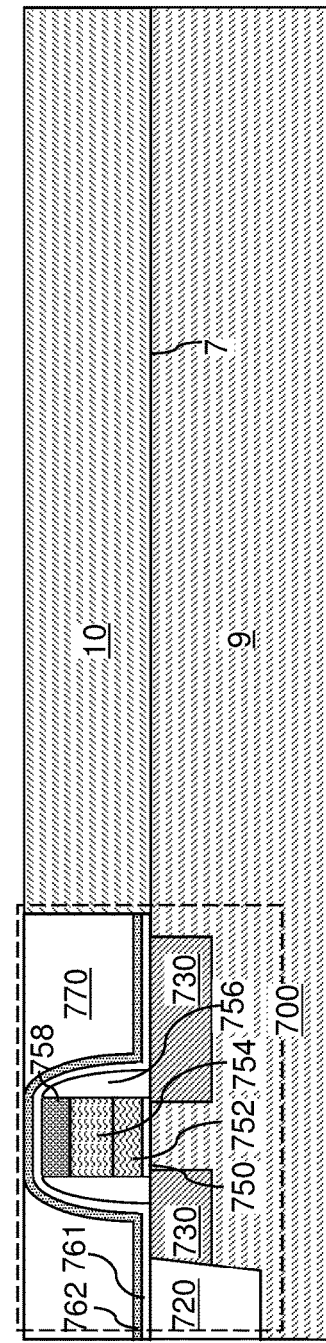
FIG. 1 is a schematic vertical cross-sectional view of a first exemplary structure after formation of at least one peripheral device and a semiconductor material layer according to a first embodiment of the present disclosure.

As discussed above, the embodiments of the present disclosure are directed to three-dimensional memory devices containing composition-controlled ferroelectric memory elements and methods of manufacturing the same, the various aspects of which are described below. The embodiments of the disclosure may be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to the first embodiment of the present disclosure is illustrated, which may be employed, for example, to fabricate a device structure containing vertical NAND memory devices. The first exemplary structure includes a substrate (9, 10), which may be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device can include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 may be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry can contain a driver circuit for memory devices to be subsequently formed, which can include at least one NAND device.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be employed for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate (9, 10) containing the memory array region 100.

Figure 2:
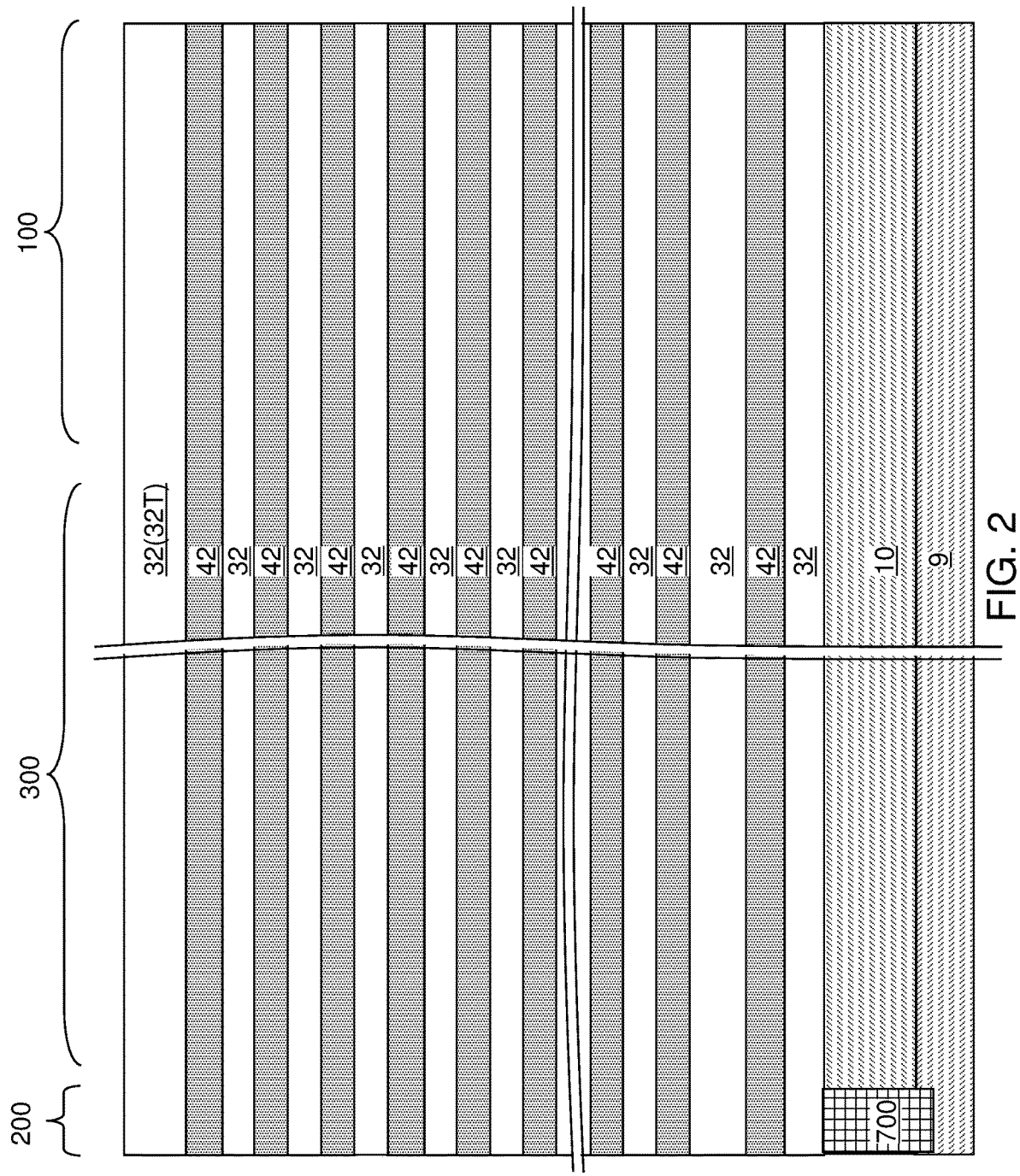
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which may be insulating layers 32) and second material layers (which may be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 may be deposited, for example, by chemical vapor deposition (CVD). For example, if silicon oxide is employed for the insulating layers 32, tetraethyl orthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

The topmost layer of the alternating stack (32, 42) may comprise a topmost insulating layer 32T, which is an insulating layer 32 that is located above all other insulating layers 32. The topmost insulating layer 32T includes a dielectric material that is different from the material of the sacrificial material layers 42. In one embodiment, the topmost insulating layer 32T can include a dielectric material that may be employed for the insulating layers 32 as described above. The topmost insulating layer 32T can have a greater thickness than each of the insulating layers 32. The topmost insulating layer 32T may be deposited, for example, by chemical vapor deposition. In one embodiment, the topmost insulating layer 32T may be a silicon oxide layer.

Figure 3:
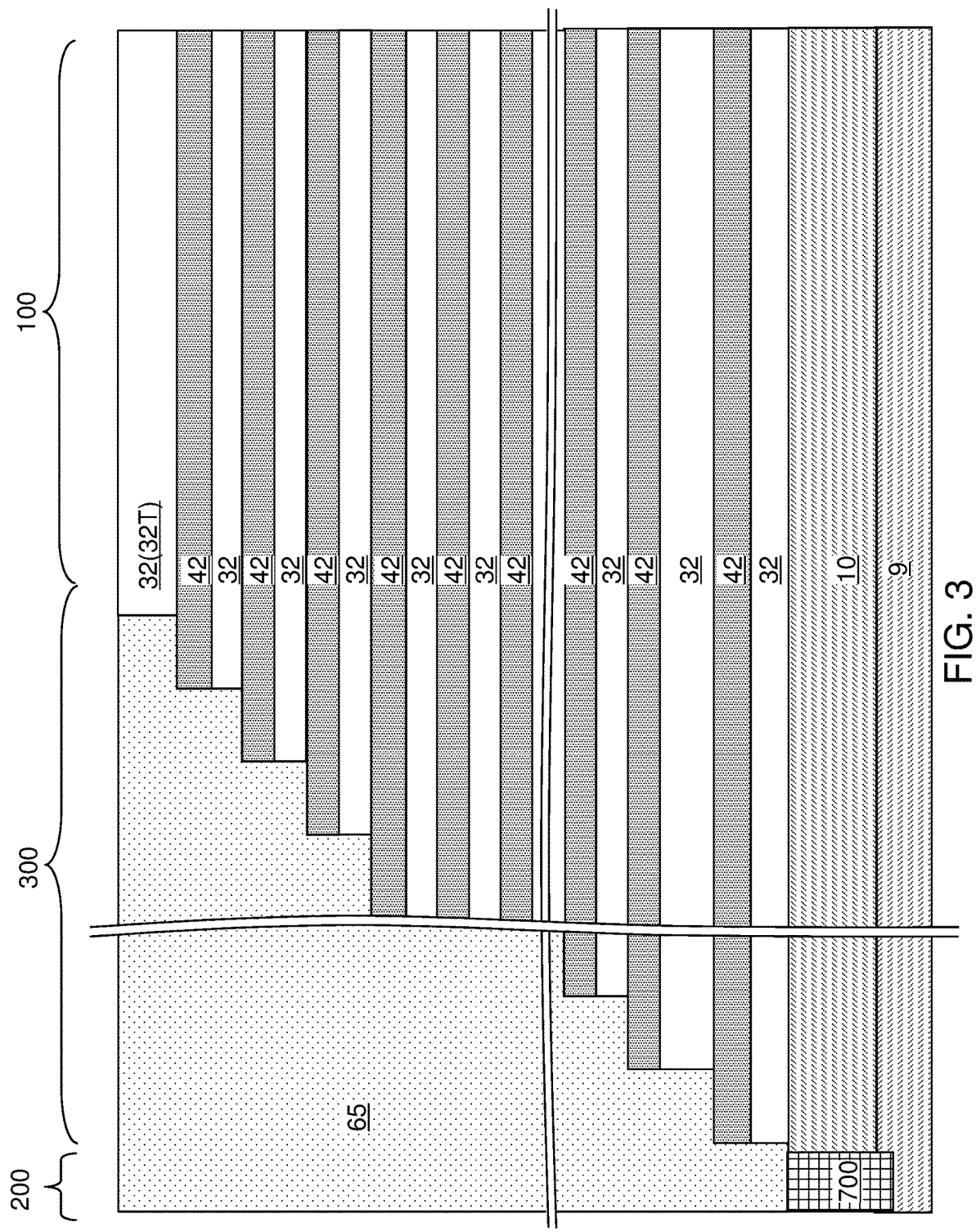
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 may be formed through the topmost insulating layer 32T and a subset of the sacrificial material layers 42 located at drain-select-levels. The drain-select-level isolation structures 72 may be formed, for example, by forming drain-select-level isolation trenches and filling the drain-select-level isolation trenches with a dielectric material such as silicon oxide. Excess portions of the dielectric material may be removed from above the top surface of the topmost insulating layer 32T.

Figure 4A:
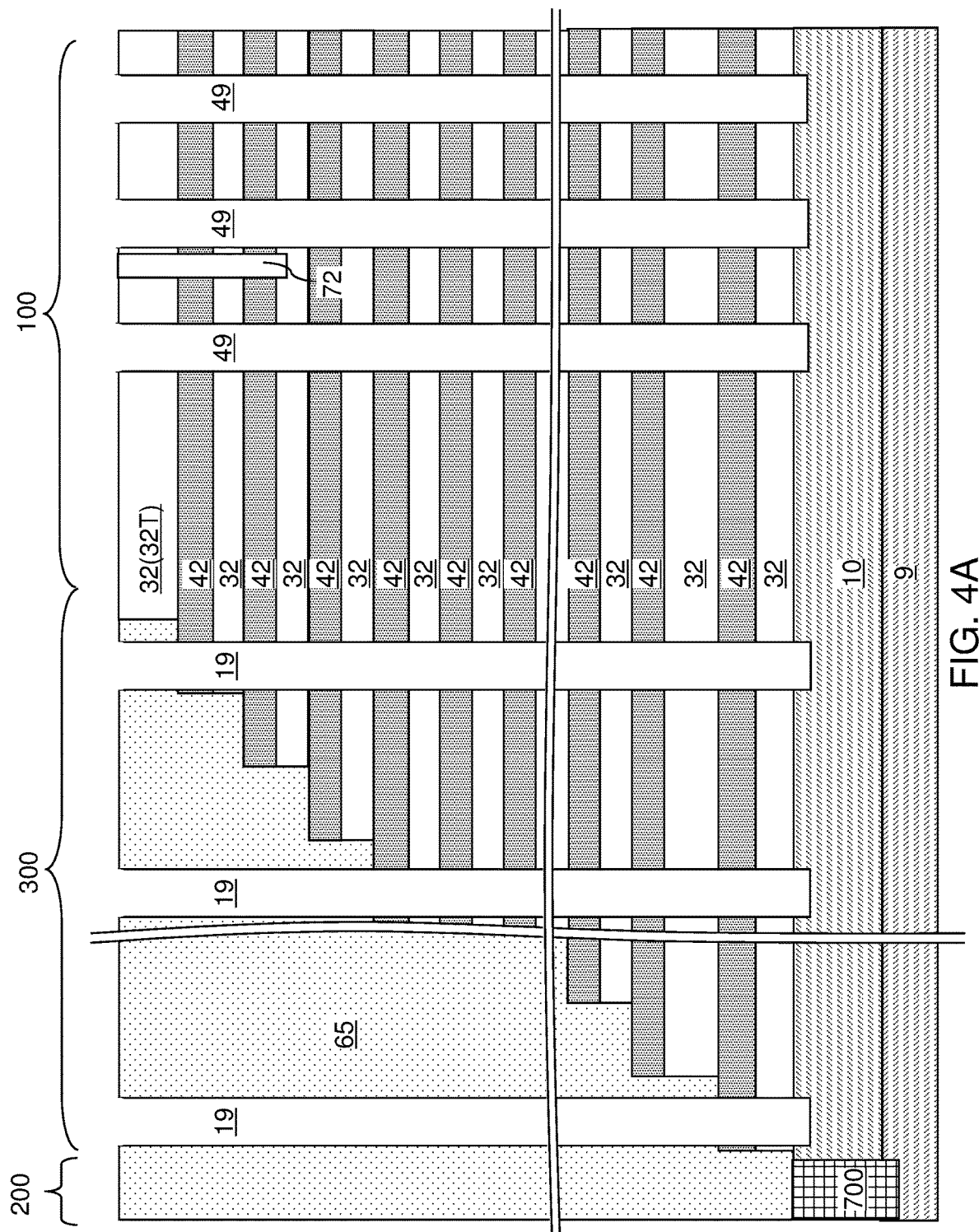
FIG. 4A is a schematic vertical cross-sectional view of the first exemplary structure after formation of memory openings and support openings according to the first embodiment of the present disclosure.
Figure 4B:
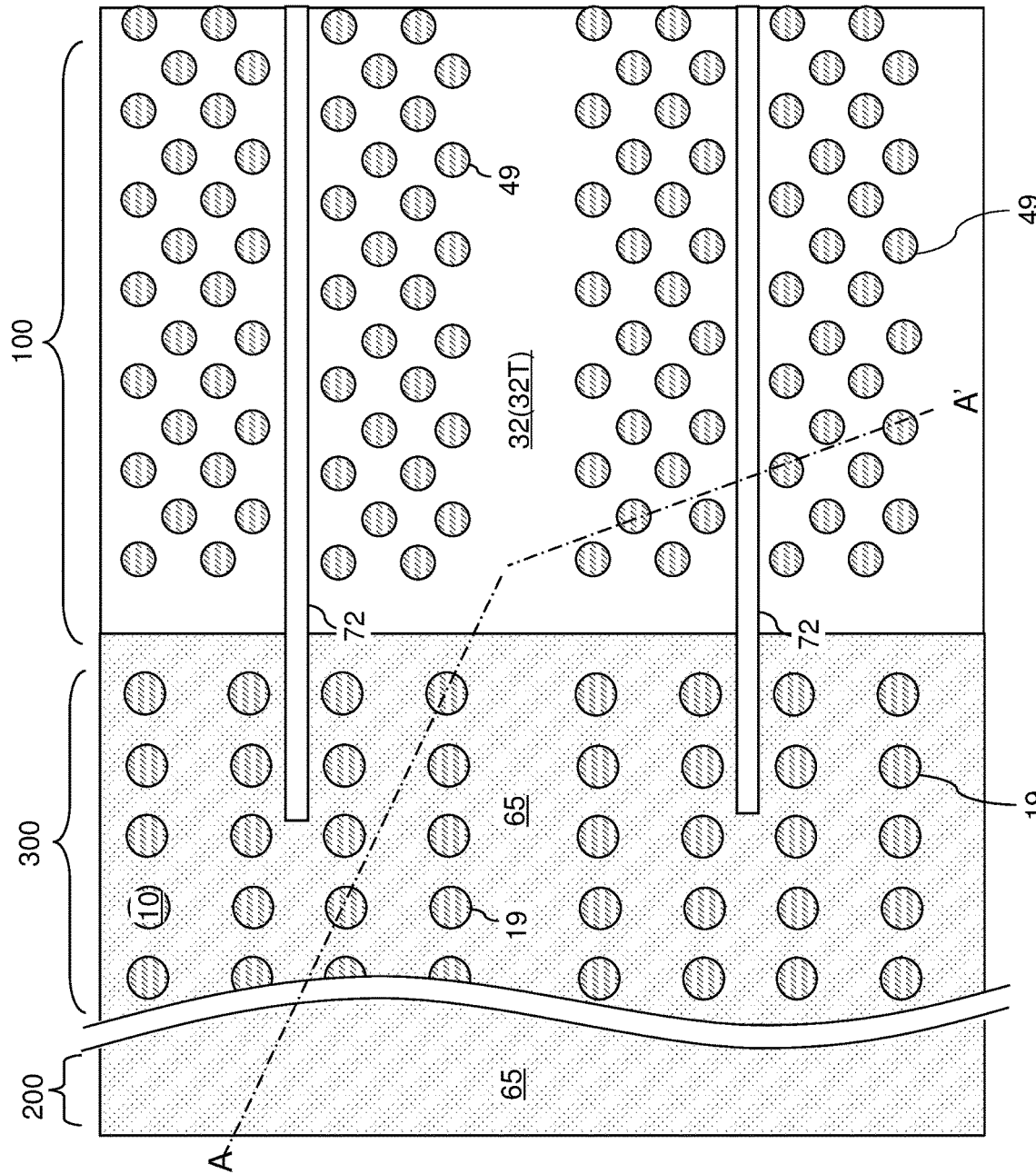
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the topmost insulating layer 32T and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths can also be employed. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

Figure 5C:
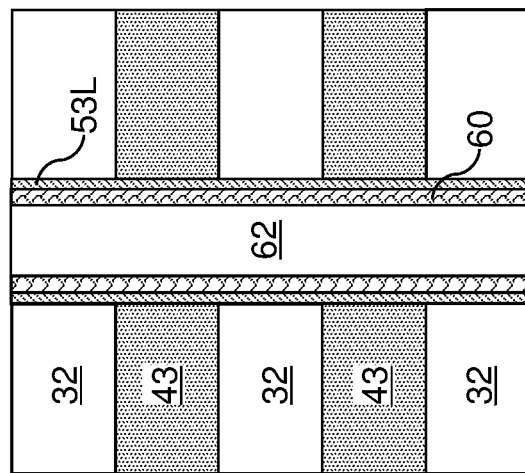
FIGS. 5A-5C are sequential schematic vertical cross-sectional views of a memory opening within the first exemplary structure during formation of a first exemplary in-process memory opening fill structure according to the first embodiment of the present disclosure.
Figure 5B:
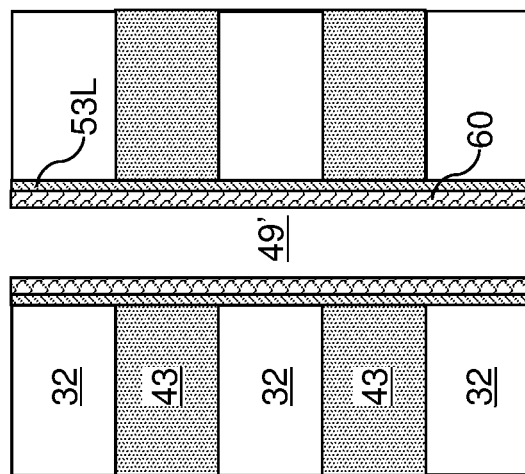
Figure 5A:
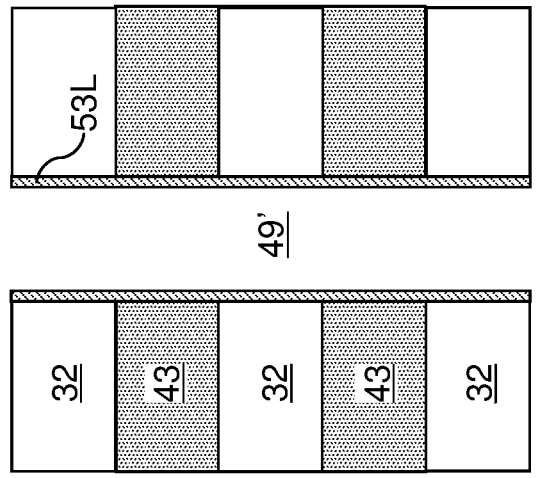

FIGS. 5A-5C are sequential schematic vertical cross-sectional views of a memory opening 49 within the first exemplary structure during formation of a first exemplary in-process memory opening fill structure 58' according to the first embodiment of the present disclosure.

Referring to FIG. 5A, a first dielectric metal oxide layer 53L comprising and/or consisting essentially of a first dielectric metal oxide material can be conformally deposited. According to an aspect of the present disclosure, the first dielectric metal oxide material is a component metal oxide material that can form a ferroelectric metal oxide material when alloyed with a second dielectric metal oxide material in a subsequent processing step. In this case, the ferroelectric metal oxide material may have a material composition of $M_\alpha Q_\gamma O_{(\beta+\delta)}$, in which M is at least one first metal element, Q is at least one second metal element different from the first metal element, and the numbers $\alpha$, $\beta$, $\gamma$, and $\delta$ are selected such that each of $M_\alpha O_\beta$, $Q_\gamma O_\delta$, and $M_\alpha Q_\gamma O_{(\beta+\delta)}$ is stoichiometric, substantially stoichiometric, or oxygen-deficient. The number of $\alpha+\beta$ may be a positive integer such as 1, 2, 3, etc. The number of $\beta+\delta$ may be an integer or may be a fraction. In one embodiment, the first metal oxide material of the first dielectric metal oxide layer 53L has a material composition of $M_\alpha O_\beta$, and the second metal oxide material to be subsequently employed has a material composition of $Q_\gamma O_\delta$, and the ferroelectric metal oxide material to be subsequently formed has a material composition of $M_\alpha Q_\gamma O_{(\beta+\delta)}$. In another embodiment, the first metal oxide material of the first dielectric metal oxide layer 53L has a material composition of $Q_\gamma O_\delta$, and the second metal oxide material to be subsequently employed has a material composition of $M_\alpha O_\beta$ and the ferroelectric metal oxide material to be subsequently formed has a material composition of $M_\alpha Q_\gamma O_{(\beta+\delta)}$.

Generally, the first dielectric metal oxide material and the second dielectric metal oxide material may be determined after selection of the ferroelectric metal oxide material to be subsequently employed in the memory devices of the present disclosure.

In one embodiment, the ferroelectric metal oxide material may be a ferroelectric hafnium-metal oxide including hafnium and at least one additional metal that is not hafnium. In this case, hafnium or a combination of hafnium and at least another metal may be employed as the at least one first metal element M or as the at least one second metal element Q within the material composition of $M_\alpha Q_\gamma O_{(\beta+\delta)}$. The ferroelectric metal oxide material having the material composition of $M_\alpha Q_\gamma O_{(\beta+\delta)}$ may comprise an orthorhombic phase hafnium-metal oxide including oxygen, hafnium, and at least one metal selected from Al, Zr, Y, Gd, La or Sr. In one embodiment, one of the first dielectric metal oxide material and the second dielectric metal oxide material may be hafnium oxide, another of the first dielectric metal oxide material and the second dielectric metal oxide material may be zirconium oxide, and the ferroelectric metal oxide material may be orthorhombic hafnium zirconium oxide. In another embodiment, one of the first dielectric metal oxide material and the second dielectric metal oxide material may be hafnium oxide, another of the first dielectric metal oxide material and the second dielectric metal oxide material may be aluminum oxide, and ferroelectric metal oxide material may be orthorhombic aluminum doped hafnium oxide.

In yet another embodiment, the ferroelectric metal oxide material may be a ferroelectric titanium-metal oxide including titanium and at least one additional metal other than titanium. In this case, titanium or a combination of titanium and at least another metal may be employed as the at least one first metal element M or as the at least one second metal element Q, while the other one of Q or M may comprise barium, lead or a combination of lead with zirconium or lanthanum within the material composition of $M_\alpha Q_\gamma O_{(\beta+\delta)}$. The ferroelectric metal oxide material having the material composition of $M_\alpha Q_\gamma O_{(\beta+\delta)}$ may comprise a titanate ferroelectric material such as barium titanate, lead titanate, lead zirconate titanate, lead lanthanum zirconate titanate ("PLZT"), etc.

The first dielectric metal oxide layer 53L may be formed by a conformal deposition process such as a chemical vapor deposition process or an atomic layer deposition process. The thickness of the first dielectric metal oxide layer 53L may be in a range from 1 nm to 20 nm, such as from 2 nm to 10 nm, although lesser and greater thicknesses may also be employed. An anisotropic etch process may be performed to remove horizontally-extending portions of the first dielectric metal oxide layer 53L. Each remaining portion of the first dielectric metal oxide layer 53L can have a respective tubular configuration, and may be located entirely within a respective memory opening 49 or within a respective support opening 19. Each first dielectric metal oxide layer 53L may be formed within a respective one of the memory openings 49 and the support openings 19. A memory cavity 49', which is an unfilled volume of a memory opening 49, may be present within each memory opening 49.

Referring to FIG. 5B, a vertical semiconductor channel 60 may be formed by conformal deposition of a semiconductor channel material on the inner sidewall of the first dielectric metal oxide layer 53L. The vertical semiconductor channel 60 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the vertical semiconductor channel 60 includes polysilicon or amorphous silicon that is subsequently crystallized into polysilicon by annealing. The vertical semiconductor channel 60 may be formed by a conformal deposition method such as low pressure chemical vapor deposition (LPCVD). The vertical semiconductor channel 60 can include electrical dopants of a first conductivity type, which may be p-type or n-type. The atomic concentration of dopants of the first conductivity type in the vertical semiconductor channel 60 may be in a range from $1.0 \times 10^{14}/cm^3$ to $3.0 \times 10^{17}/cm^3$, although lesser and greater dopant concentrations can also be employed. The thickness of the vertical semiconductor channel 60 may be in a range from 2 nm to 10 nm, although lesser and greater thicknesses can also be employed. An optional memory cavity 49' may be present in the volume of each memory opening 49 that is not filled with the vertical semiconductor channel 60.

Referring to FIG. 5C, a dielectric fill material, such as silicon oxide may be deposited in the memory cavities 49' in case the memory cavities 49' are present. A recess etch process may be performed to remove portions of the dielectric fill material from above the horizontal plane including the top surface of the topmost insulating layer 32T, and to vertically recess the dielectric fill material such that each remaining portion of the dielectric fill material has a top surface at, or about, the horizontal plane including the bottom surface of the topmost insulating layer 32T. Each remaining portion of the dielectric fill material constitutes a dielectric core 62.

Figure 6:
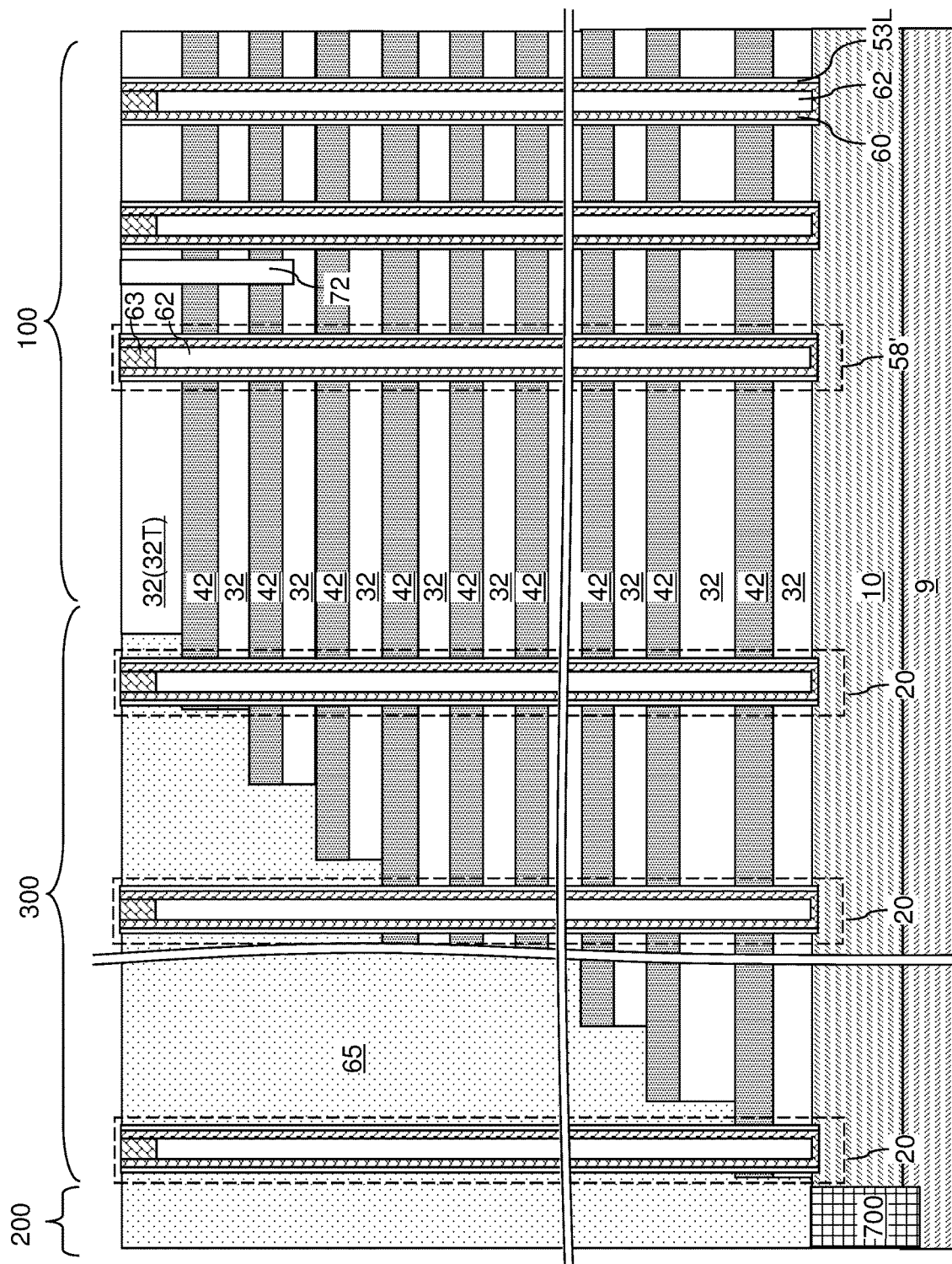
FIG. 6 is a schematic vertical cross-sectional view of the first exemplary structure after formation of in-process memory opening fill structures and support pillar structures according to the first embodiment of the present disclosure.

Referring to FIG. 6, a doped semiconductor material including dopants of a second conductivity type can be deposited in the recess regions overlying the dielectric cores 62. The second conductivity type is the opposite of the first conductivity type. The atomic concentration of dopants of the second conductivity in the drain regions may be in a range from $5.0 \times 10^{18}/cm^3$ to $2.0 \times 10^{21}/cm^3$, although lesser and greater thicknesses can also be employed. Portions of the deposited doped semiconductor material having a doping of the second conductivity type and the semiconductor material of the vertical semiconductor channels 60 can be removed from above the horizontal plane including the top surface of the topmost insulating layer 32T by a planarization process, which may employ a chemical mechanical polishing process and/or a recess etch process. Each remaining portion of the doped semiconductor material having a doping of the second conductivity type constitutes a drain region 63.

The set of all material portions that fills a memory opening 49 constitutes an in-process memory opening fill structure 58'. The set of all material portions that fills a support opening constitutes a support pillar structure 20. Each of the in-process memory opening fill structures 58' and the support pillar structures 20 may comprise a respective first dielectric metal oxide layer 53L contacting an entirety of a sidewall of a respective memory opening 49 or a respective support opening 19 and comprising and/or consisting essentially of the first dielectric metal oxide material having a material composition of $M_\alpha O_\beta$, a respective vertical semiconductor channel 60 contacting a respective surface segment of the semiconductor material layer 10 and the first dielectric metal oxide layer 53L, a respective dielectric core 62, and a respective drain region 63 that contacts an upper end of the respective vertical semiconductor channel 60. In one embodiment, top surfaces of the in-process memory opening fill structures 58' and the support pillar structures 20 may be formed within the horizontal plane including the top surface of the topmost insulating layer 32T.

FIGS. 7A-7C are sequential schematic vertical cross-sectional views of a memory opening 49 within the first exemplary structure during formation of a second exemplary in-process memory opening fill structure 58' according to an embodiment of the present disclosure. The second exemplary in-process memory opening fill structures 58' may be formed in each memory opening 49 in lieu of the first exemplary in-process memory opening fill structures 58'.

Referring to FIG. 7A, the second exemplary in-process memory opening fill structures 58' may be derived from the first exemplary structure illustrated in FIG. 5A by forming an insulating barrier layer 56 on the first dielectric metal oxide layer 53L. In one embodiment, the insulating barrier layer 56 comprises a dielectric oxide material, such as silicon oxide or a dielectric metal oxide material, such as aluminum oxide, having a different material composition than the material of the first dielectric metal oxide layer 53L. The thickness of the insulating barrier layer 56 may be in a range from 1 nm to 10 nm, such as from 2 nm to 5 nm, although lesser and greater thicknesses may also be employed. An anisotropic etch process may be performed to remove horizontally-extending portions of the insulating barrier layer 56 and the first dielectric metal oxide layer 53L. A layer stack of a first dielectric metal oxide layer 53L and an insulating barrier layer 56 may be formed in each of the memory openings 49 and the support openings 49. Each first dielectric metal oxide layer 53L may have a tubular configuration. Each insulating barrier layer 56 may have a tubular configuration.

Referring to FIG. 7B, the processing steps of FIG. 5B may be performed to form a vertical semiconductor channel 60 on an inner sidewall of each insulating barrier layer 56.

Referring to FIG. 7C, the processing steps of FIG. 5C may be performed to form a dielectric core 62 within each of the memory openings 49 and the support openings 19.

Subsequently, the processing steps of FIG. 6 can be performed to form a drain region 63 within each memory opening 49 and within each support opening 19. The set of all material portions that fills a memory opening 49 constitutes an in-process memory opening fill structure 58'. The set of all material portions that fills a support opening constitutes a support pillar structure 20. In case the processing steps of FIGS. 7A-7C are employed in lieu of the processing steps of FIGS. 5A-5C, each of the in-process memory opening fill structures 58' and the support pillar structures 20 may comprise a respective first dielectric metal oxide layer 53L contacting an entirety of a sidewall of a respective memory opening 49 or a respective support opening 19 and comprising and/or consisting essentially of the first dielectric metal oxide material having a material composition of $M_\alpha O_\beta$, a respective insulating barrier layer 56 contacting an inner sidewall of the respective first dielectric metal oxide layer 53L, a respective vertical semiconductor channel 60 contacting a respective surface segment of the semiconductor material layer 10 and the insulating barrier layer 56, a respective dielectric core 62, and a respective drain region 63 that contacts an upper end of the respective vertical semiconductor channel 60. In one embodiment, top surfaces of the in-process memory opening fill structures 58 and the support pillar structures 20 may be formed within the horizontal plane including the top surface of the topmost insulating layer 32T.

Figure 8B:
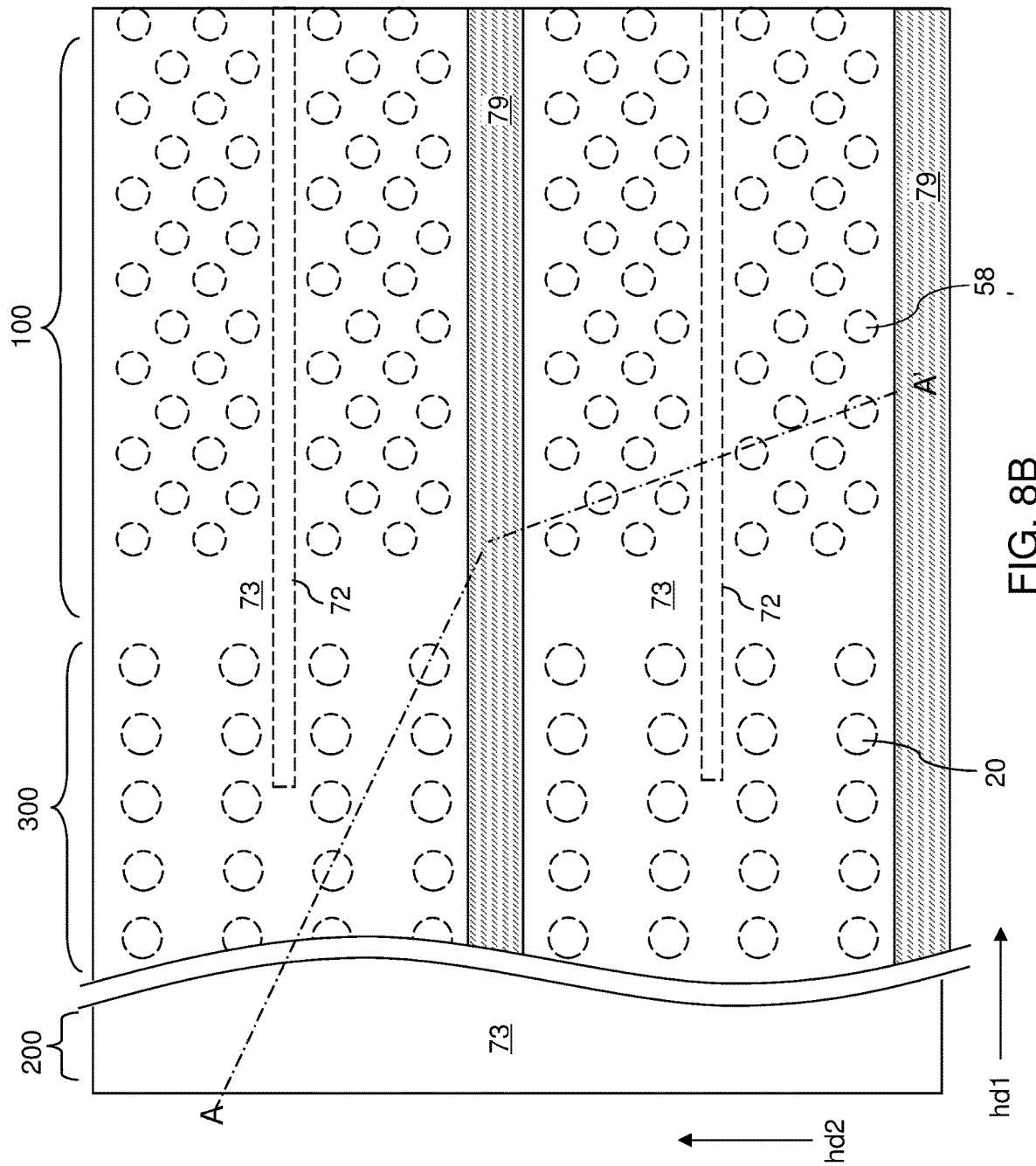
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a contact level dielectric layer 73 may be formed over the alternating stack (32, 42) of insulating layer 32 and sacrificial material layers 42, and over the in-process memory opening fill structures 58' and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) may be applied over the contact level dielectric layer 73, and is lithographically patterned to form openings in areas between clusters of memory opening fill structures 58. The pattern in the photoresist layer may be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 may be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure may be subsequently formed. The photoresist layer may be removed, for example, by ashing.

Figure 9:
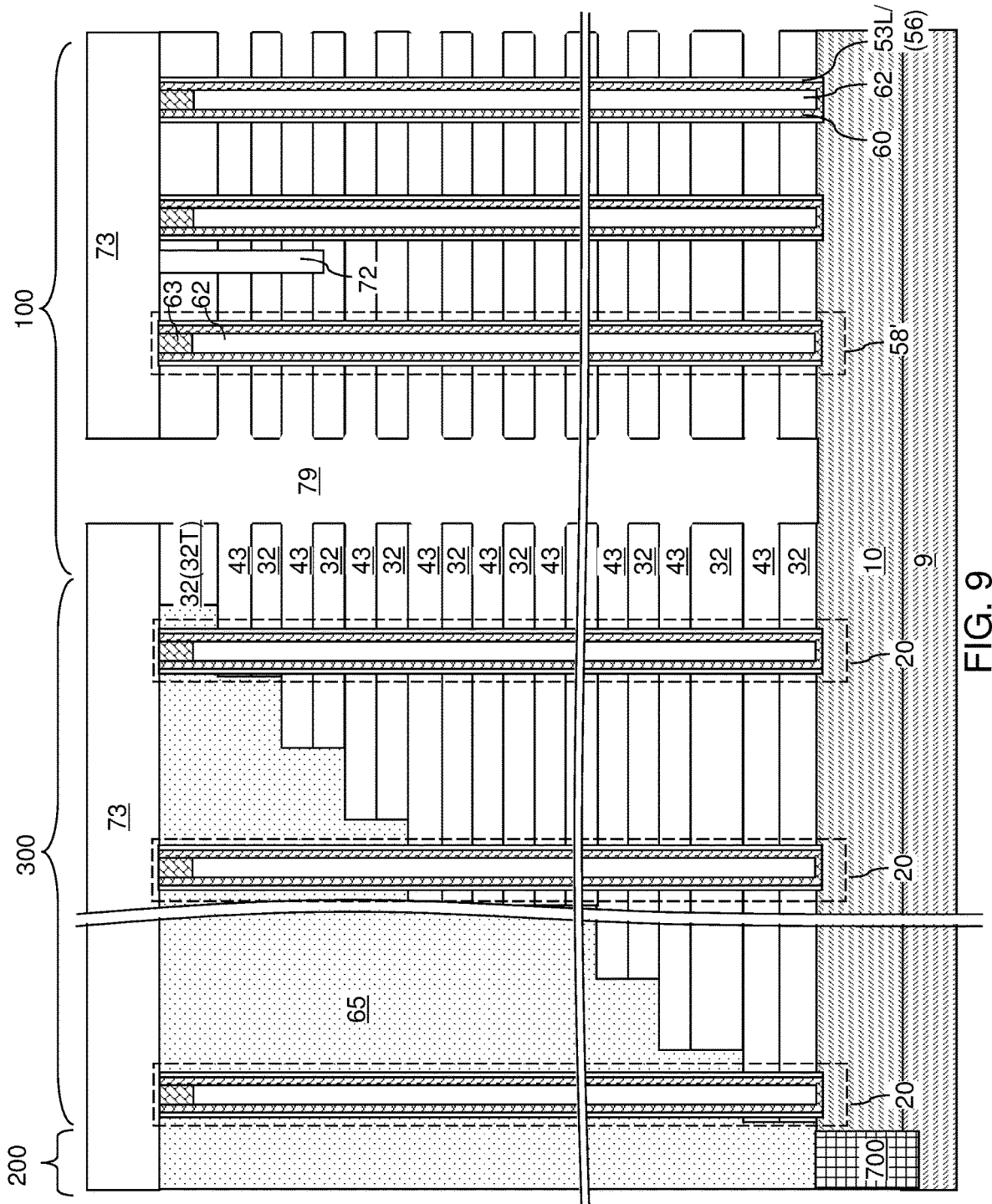
FIG. 9 is a schematic vertical cross-sectional view of the first exemplary structure after formation of backside recesses according to the first embodiment of the present disclosure.
Figure 10C:
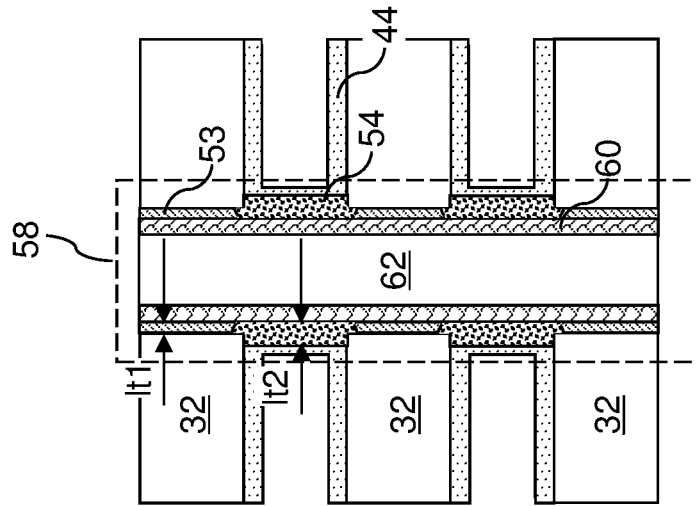
FIGS. 10A-10D are sequential vertical cross-sectional views of a region of the first exemplary structure during conversion of a first exemplary in-process memory opening fill structure into a first exemplary memory opening fill structure and formation of electrically conductive layers according to the first embodiment of the present disclosure.
Figure 10B:
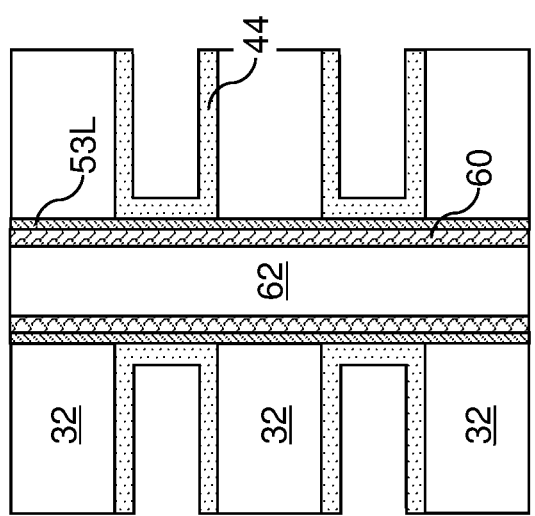
Figure 10A:
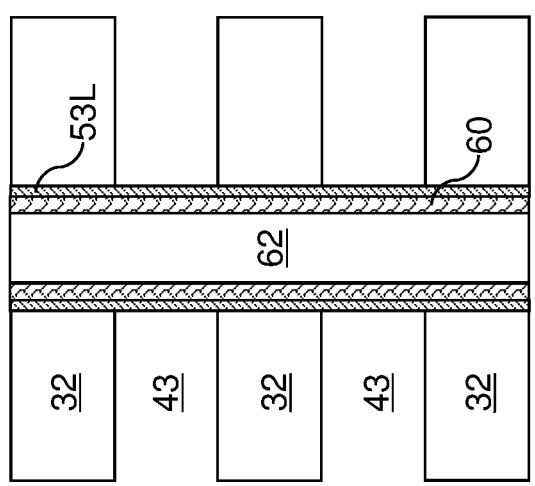

Referring to FIGS. 9 and 10A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the first dielectric metal oxide layers 53L. In one embodiment, the sacrificial material layers 42 can include silicon nitride, and the materials of the insulating layers 32 and the retro-stepped dielectric material portion 65 can be selected from silicon oxide and dielectric metal oxides. Outer surface segments of each first dielectric metal oxide layer 53L can be physically exposed to the backside recesses 43.

The etch process that removes the second material selective to the first material and the first dielectric metal oxide layers 53L can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the in-process memory opening fill structures 58' provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the in-process memory opening fill structures 58' are formed are herein referred to as front side openings or front side cavities in contrast with the backside recesses 43.

In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 10B, a second dielectric metal oxide layer 44 can be conformally deposited in the backside recesses 43, peripheral regions of the backside trenches 79, and over the contact-level dielectric layer 73. The second dielectric metal oxide layer 44 comprises and/or consists essentially of the second dielectric metal oxide material discussed above, and is also referred to as a backside dielectric material layer. The second dielectric metal oxide material is a dielectric material that forms a ferroelectric metal oxide material when alloyed (i.e., reacted) with the first dielectric metal oxide material as discussed above.

As discussed above, the first metal oxide material of the first dielectric metal oxide layer 53L has a material composition of $M_\alpha O_\beta$, and the second metal oxide material of the second dielectric metal oxide layer 44 has a material composition of $Q_\gamma O_\delta$, and the ferroelectric metal oxide material to be subsequently formed has a material composition of $M_\alpha Q_\gamma O_{(\beta+\delta)}$. If M is hafnium and the first dielectric metal oxide layer 53L comprises hafnium oxide, then Q may be zirconium or aluminum, and the second dielectric metal oxide layer 44 comprises zirconium oxide or aluminum oxide.

The second dielectric metal oxide layer 44 may be formed by a conformal deposition process such as a chemical vapor deposition process or an atomic layer deposition process. The thickness of the second dielectric metal oxide layer 44 may be in a range from 1 nm to 20 nm, such as from 2 nm to 10 nm, although lesser and greater thicknesses may also be employed.

Referring to FIG. 10C, a thermal anneal process may be performed to react the first dielectric metal oxide layer 53L and the second dielectric metal oxide layer 44. For example, the anneal may induce interdiffusion of metal atoms across the interface between the first dielectric metal oxide layer 53L and the second dielectric metal oxide layer 44 around each memory opening 49. The elevated temperature of the thermal anneal process and the duration of the thermal anneal process can be selected such that the first dielectric metal oxide material of the first dielectric metal oxide layer 53L and the second dielectric metal oxide material of the second dielectric metal oxide layer 44 alloy (i.e., react) with each other to form the ferroelectric metal oxide material having an average material composition of $M_\alpha Q_\gamma O_{(\beta+\delta)}$. As discussed above, M is at least one first metal element, Q is at least one second metal element different from the first metal element, and the numbers $\alpha$, $\beta$, $\gamma$, and $\delta$ are selected such that each of $M_\alpha O_\beta$, $Q_\gamma O_\delta$, and $M_\alpha Q_\gamma O_{(\beta+\delta)}$ is stoichiometric, substantially stoichiometric, or oxygen-deficient.

The ferroelectric metal oxide material may be formed as vertically discrete material portions at levels of the backside recesses 43, and are not merged with each other vertically. Each discrete portion of the ferroelectric metal oxide material constitutes a discrete ferroelectric material portion 54. A vertical stack of discrete ferroelectric material portions 54 can be formed by interdiffusing the first dielectric metal oxide material and the second dielectric metal oxide material at interfaces between the first dielectric metal oxide layer 53L and the second dielectric metal oxide layer 44. The vertical stack of discrete ferroelectric material portions 54 comprises a ferroelectric alloy material including an alloy of the first dielectric metal oxide material and the second dielectric metal oxide material, and may have an average material composition of $M_\alpha Q_\gamma O_{(\beta+\delta)}$. In one embodiment, each of the discrete ferroelectric material portions 54 may have a cylindrical configuration having a vertical cylindrical inner sidewall and a vertical cylindrical outer sidewall.

In one embodiment, if the vertical semiconductor channel 60 comprises amorphous silicon prior to the anneal, then the anneal may be carried out at a sufficient temperature to simultaneously crystallize the amorphous silicon into polysilicon and to react the first dielectric metal oxide layer 53L and the second dielectric metal oxide layer 44. For example, the anneal may be carried out at a temperature of 650 to 950 degrees Celsius to form a polysilicon vertical semiconductor channel 60 and to form vertical stack of discrete ferroelectric material portions 54.

Furthermore, if the first dielectric metal oxide layer 53L and/or the second dielectric metal oxide layer 44 are deposited in the amorphous state and/or in a crystalline state that does not provide sufficient ferroelectric properties, then the ferroelectric material portions 54 may be crystallized during the alloying. The crystallization during alloying may impart texture to the ferroelectric material portions 54, which may improve their ferroelectric properties. Furthermore, the crystallization and texturing of the ferroelectric material portions 54 occurs during the alloying rather than during their deposition. Therefore, a crystalline seed layer is not required to form crystalline, textured ferroelectric material portions 54. This simplifies the formation process.

The discrete ferroelectric material portions 54 reduce cross talk between vertically adjacent memory cells relative to a continuous ferroelectric material layer. Furthermore, discrete ferroelectric material portions 54 are formed using a simple alloying of front and backside metal oxide layers without requiring a separate etching step to separate a ferroelectric layer into vertically discrete portions. This simplifies the formation process of the discrete ferroelectric material portions 54 and provides a more precise control of the ratio of the metal atoms (e.g., Hf:Zr ratio) in the ferroelectric material portions 54. The improve metal ratio control improves the ferroelectric performance of the ferroelectric material portions 54.

In one embodiment, the elevated temperature and the duration of the thermal anneal process can be selected such that unreacted remaining tubular portions of the second dielectric metal oxide layer 44 remain on the vertical stack of discrete ferroelectric material portions 54 around each memory opening 49. Remaining portions of the first dielectric metal oxide layer 53L that are not incorporated into the vertical stack of discrete ferroelectric material portions 54 comprise a vertical stack of discrete dielectric material portions 53. The vertical stack of discrete dielectric material portions 53 comprise and/or consist essentially of the first dielectric metal oxide material, and is vertically interlaced with the vertical stack of discrete ferroelectric material portions 54. The discrete dielectric material portions 53 may comprise non-ferroelectric dielectric material.

In one embodiment, each discrete dielectric material portion 53 within the vertical stack of discrete dielectric material portions 53 is in direct contact with a sidewall of a respective insulating layer 32 of the insulating layers 32. In one embodiment, each discrete dielectric material portion 53 has a first lateral thickness lt1 between a respective inner sidewall and a respective outer sidewall, and each of the discrete ferroelectric material portions 54 has a second lateral thickness lt2 between a respective inner sidewall and the respective outer sidewall. In one embodiment, the second lateral thickness lt2 is greater than the first lateral thickness lt1.

In one embodiment, the inner sidewalls of the discrete dielectric material portions 53 and the inner sidewalls of the discrete ferroelectric material portions 54 are vertically coincident. As used herein, a first surface and a second surface are "vertically coincident" if the second surface underlies or overlies the first surface and if there exists a vertical plane including the first surface and the second surface. In one embodiment, each inner sidewall of the discrete ferroelectric material portions 54 comprises a respective first inner cylindrical sidewall, each outer sidewall of the discrete ferroelectric material portions 54 comprises a respective first outer cylindrical sidewall, each inner sidewall of the discrete dielectric material portions 53 comprises a respective second inner cylindrical sidewall, and each outer sidewall of the discrete dielectric material portions 53 comprises a respective second outer cylindrical sidewall.

Each contiguous combination of a vertical stack of discrete ferroelectric material portions 54, a vertical stack of discrete dielectric material portions 53, a vertical semiconductor channel 60, a dielectric core 62, and a drain region 63 located in a respective memory opening 49 constitutes a memory opening fill structure 58, which is derived from a respective in-process memory opening fill structure 58'. Each support pillar structure 20 may comprise a respective combination of a vertical stack of discrete ferroelectric material portions 54, a vertical stack of discrete dielectric material portions 53, a vertical semiconductor channel 60, a dielectric core 62, and a drain region 63 after the processing steps of FIG. 10C.

Figure 10D:
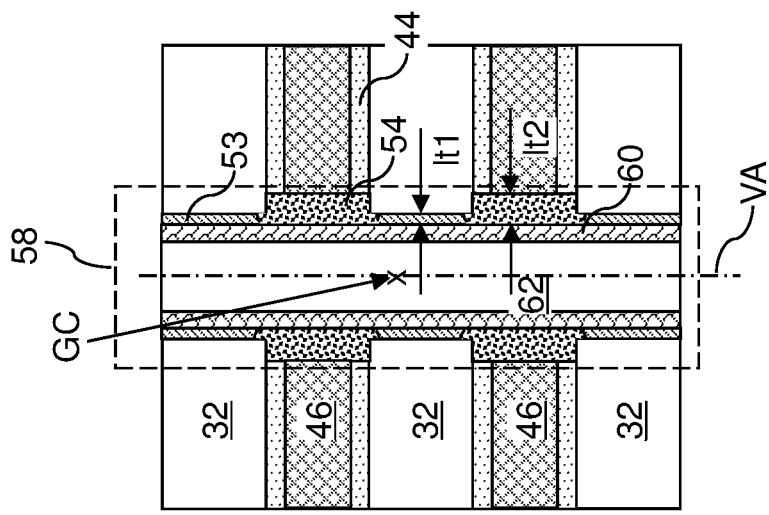

Referring to FIG. 10D, at least one electrically conductive material can be conformally deposited in unfilled volumes of the backside recesses 43, in peripheral regions of the backside trenches 79, and above the contact-level dielectric layer 73. For example, the at least one electrically conductive material may comprise a metallic barrier layer and a metallic fill material. For example, a metallic barrier layer (not expressly shown) can be conformally deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, MoN or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

Subsequently, a metal fill material is deposited in the plurality of backside recesses 43, on the sidewalls of the at least one the backside trench 79, and over the top surface of the contact-level dielectric layer 73 to form a metallic fill material layer (not shown). The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 73. The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46.

Each electrically conductive layer 46 can be a conductive line structure through which the memory opening fill structures 58 vertically extend. Thus, the sacrificial material layers 42 are replaced with the electrically conductive layers 46.

In one embodiment, each of the discrete ferroelectric material portions 54 comprises a respective outer sidewall that laterally protrudes outward by a greater lateral distance from a vertical axis VA passing through a geometrical center GC of the memory opening fill structure 58 than interfaces between the memory opening fill structure 58 and the insulating layers 32 laterally protrude from the vertical axis VA. As used herein, a "geometrical center" of a structure or a volume refers to a point corresponding to the center of gravity for an hypothetical object having a uniform density and having a same shape and location as the structure or as the volume. In one embodiment, second dielectric metal oxide layers 44 comprising the second dielectric metal oxide material are interposed between vertically neighboring pairs of an insulating layer 32 among the insulating layers 32 and an electrically conductive layer 46 of the electrically conductive layers 46.

In one embodiment, each of the second dielectric metal oxide layers 44 is in direct contact with an outer sidewall of a respective one of the discrete ferroelectric material portions 54. In one embodiment, one, a plurality and/or each of the second dielectric metal oxide layers 44 comprises a first horizontally-extending portion 44A contacting a bottom surface of an overlying insulating layer 32 of the insulating layers 32, a second horizontally-extending portion 44B contacting a top surface of an underlying insulating layer 32 of the insulating layers 32, and a tubular portion 44C connecting the first horizontally-extending portion 44A and the second horizontally-extending portion 44B and laterally surrounding the memory opening fill structure 58. In one embodiment, the cylindrical portion 44C has a uniform lateral thickness between an inner sidewall and an outer sidewall, the first horizontally-extending portion 44A and the second horizontally-extending portion 44B have a uniform vertical thickness, and the uniform lateral thickness is less than the uniform vertical thickness.

Generally, the in-process memory opening fill structures 58' are converted into a respective memory opening fill structure 58, and electrically conductive layers 46 are formed in remaining volumes of the backside recesses 43 around the vertical stacks of discrete ferroelectric material portions 54 in the memory opening fill structures 58. Each vertical stack of discrete ferroelectric material portions 54 may be in direct contact with cylindrical surface segments of a respective vertical semiconductor channel 60.

Figure 10E:
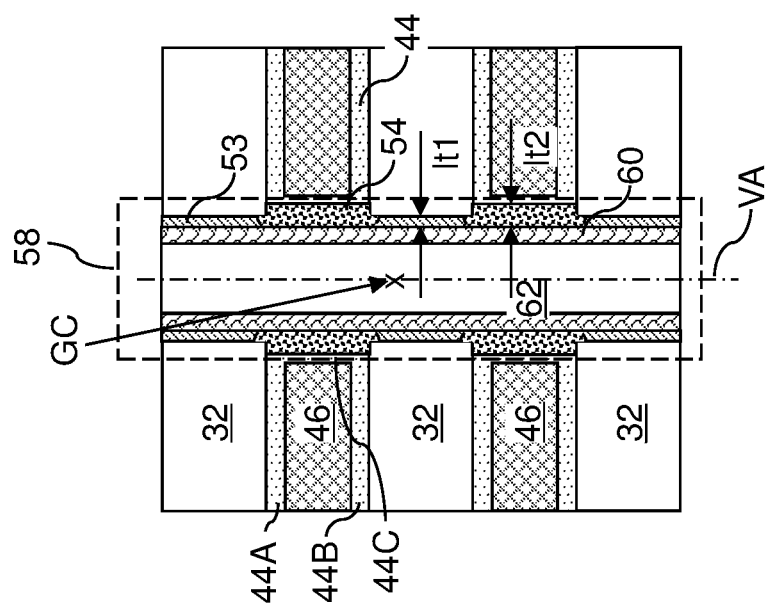
FIG. 10E is a vertical cross-sectional view of a region of the first exemplary structure after formation of a first alternative embodiment of the first exemplary memory opening fill structure and electrically conductive layers according to the first embodiment of the present disclosure.

Referring to FIG. 10E, a first alternative embodiment of the first exemplary memory opening fill structure 58 is illustrated, which can be derived from the first exemplary memory opening fill structure 58 illustrated in FIG. 10D by reacting the entire thickness of the vertical tubular portions of the second dielectric metal oxide layers 44 with the first dielectric metal oxide layer 53L. In this alternative embodiment, the second lateral thickness lt2 of the discrete ferroelectric material portions 54 is increased relative to the second lateral thickness lt2 shown in FIG. 10. In this alternative embodiment, the second dielectric metal oxide layers 44 do not include tubular portions that laterally surround and contact a respective one of the discrete ferroelectric material portions 54. Thus, the electrically conductive layers 46 are formed directly on outer sidewalls of the discrete ferroelectric material portions 54 and directly on remaining portions of the second dielectric metal oxide layers 44, such as the horizontally-extending portions of the second dielectric metal oxide layer 44. The electrically conductive layers 46 are in direct contact with an outer sidewall of a respective one of the discrete ferroelectric material portions 54.

Figure 11B:
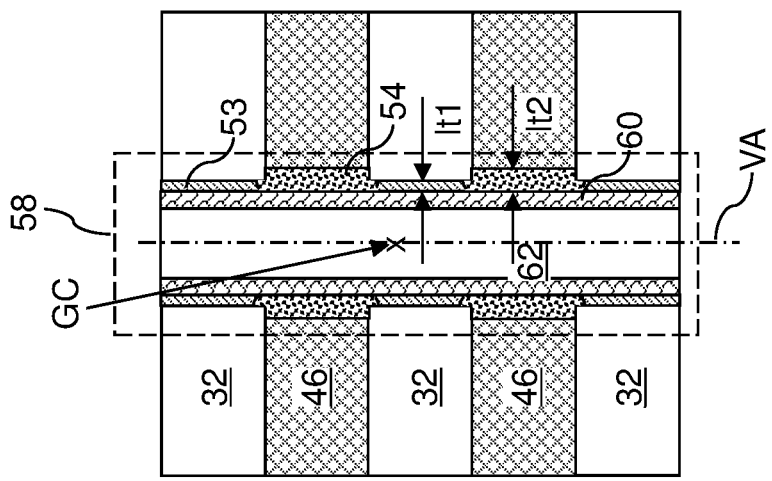
FIGS. 11A and 11B are sequential vertical cross-sectional views of a region of the first exemplary structure during formation of a second alternative embodiment of the first exemplary memory opening fill structure and electrically conductive layers according to the first embodiment of the present disclosure.
Figure 11A:
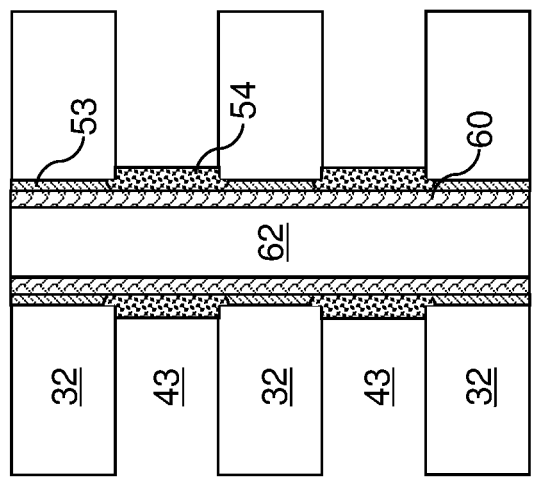

FIGS. 11A and 11B are sequential vertical cross-sectional views of a region of the first exemplary structure during formation of a second alternative embodiment of the first exemplary memory opening fill structure 58 and electrically conductive layers 46 according to the first embodiment of the present disclosure.

Referring to FIG. 11A, the second alternative embodiment of the first exemplary memory opening fill structure 58 can be derived from the first exemplary structure of FIG. 10C by selectively removing the second dielectric metal oxide layer 44 selective to the material of the discrete ferroelectric material portions 54. The selective removal may comprise a selective etching process, such as atomic layer etching. For example, if the second dielectric metal oxide layer 44 comprises zirconium oxide, then it may be selectively etched relative to hafnium oxide or hafnium zirconium oxide using thermal atomic etching using sequential hydrogen fluoride and dimethylaluminum chloride exposures, as described in Y. Lee, et al., "Thermal atomic layer etching of $Al_2O_3$, $HfO_2$, and $ZrO_2$ using sequential hydrogen fluoride and dimethylaluminum chloride exposures." *J. Phys. Chem. C* (2019) 123, 30 18455-18466, incorporated herein by reference in its entirety. Horizontal top surfaces and horizontal bottom surfaces of the insulating layers 32 may be physically exposed upon removal of the second dielectric metal oxide layer 44.

Referring to FIG. 11B, the processing steps of FIG. 10D can be performed to form electrically conductive layers 46 in the backside recesses 43 around and directly on the vertical stacks of discrete ferroelectric material portions 54. The electrically conductive layers 46 are formed directly on horizontal surfaces of the insulating layers 32 and directly on outer sidewalls of the discrete ferroelectric material portions 54. The electrically conductive layers 46 are in direct contact with an outer sidewall of a respective one of the discrete ferroelectric material portions 54. In one embodiment, the entirety of the outer sidewall of each of the discrete ferroelectric material portions 54 may be in direct contact with a cylindrical sidewall of a respective one of the electrically conductive layers 46.

FIGS. 12A-12D are sequential vertical cross-sectional views of a region of the second exemplary structure during conversion of a second exemplary in-process memory opening fill structure 58' into a second exemplary memory opening fill structure 58 and formation of electrically conductive layers 46 according to the first embodiment of the present disclosure.

Figure 12C:
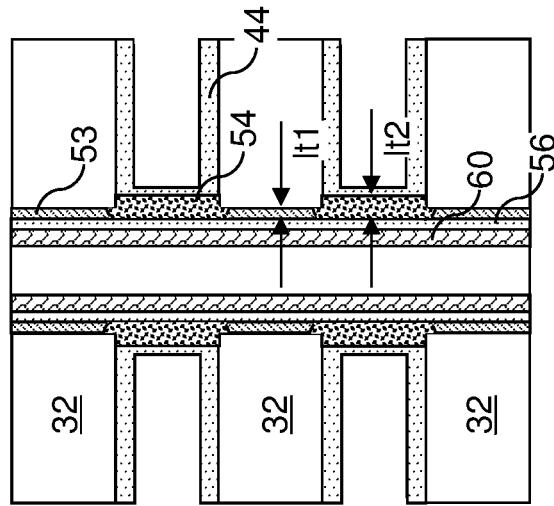
FIGS. 12A-12D are sequential vertical cross-sectional views of a region of the first exemplary structure during conversion of a second exemplary in-process memory opening fill structure into a second exemplary memory opening fill structure and formation of electrically conductive layers according to the first embodiment of the present disclosure.
Figure 12B:
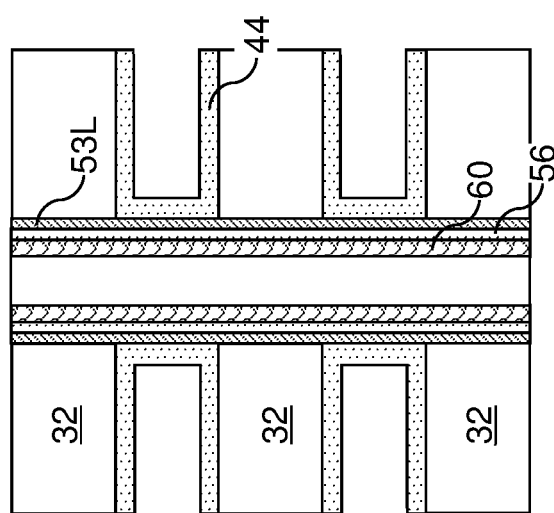
Figure 12A:
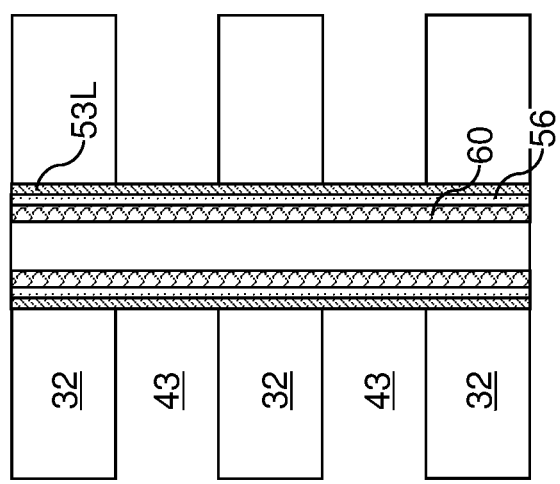

Referring to FIG. 12A, the processing steps described above with reference to FIGS. 9 and 10A may be performed for a configuration of the first exemplary structure in which the second exemplary in-process memory opening fill structures 58' illustrated in FIG. 7C are formed in the memory openings 49 in lieu of the first exemplary in-process memory opening fill structures 58' illustrated in FIG. 5C. In this case, the memory opening fill structure 58 comprises an insulating barrier layer 56 located between the vertical stack of discrete ferroelectric material portions 54 and the vertical semiconductor channel 60.

Referring to FIG. 12B, the processing steps described with reference to FIG. 10B may be performed to form the second dielectric metal oxide layer 44.

Referring to FIG. 12C, the processing steps described with reference to FIG. 10C may be performed to form a vertical stack of discrete ferroelectric material portions 54. As discussed above, the vertical stack of discrete ferroelectric material portions 54 comprises a ferroelectric alloy material including an alloy of the first dielectric metal oxide material and the second dielectric metal oxide material. Each discrete dielectric material portion 53 and each discrete ferroelectric material portion 54 are in direct contact with the insulating barrier layer 56. In one embodiment, the discrete dielectric material portions 53 comprise hafnium oxide, the discrete ferroelectric material portions 54 comprise hafnium zirconium oxide, and the insulating barrier layer 56 comprises aluminum oxide.

Figure 12E:
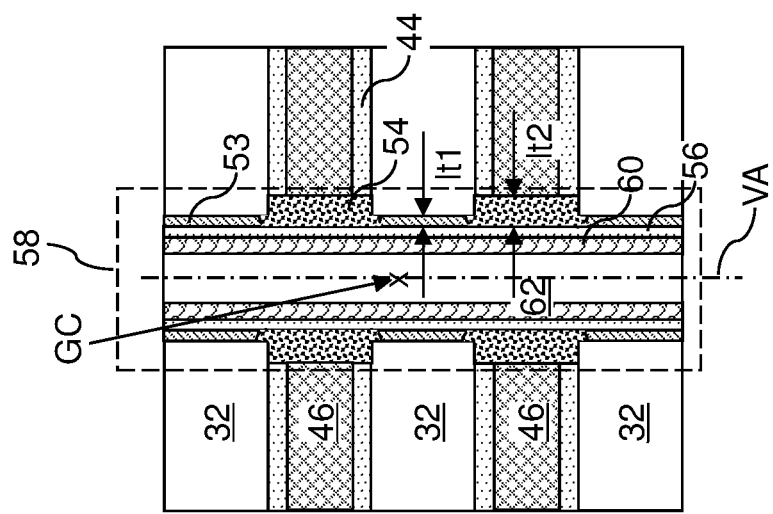
FIG. 12E is a vertical cross-sectional view of a region of the first exemplary structure after formation of a first alternative embodiment of the second exemplary memory opening fill structure and electrically conductive layers according to the first embodiment of the present disclosure.
Figure 12D:
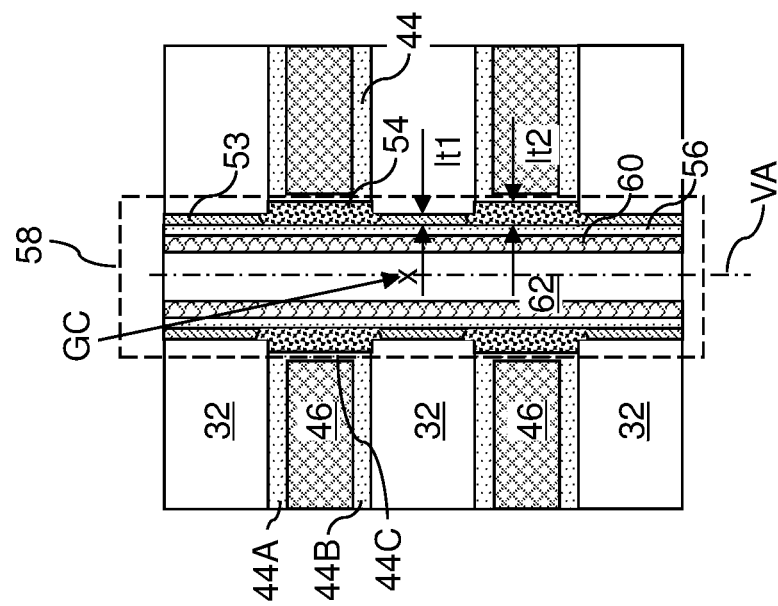

Referring to FIG. 12D, the processing steps described with reference to FIG. 10D may be performed to form electrically conductive layers 46 in remaining volumes of the backside recesses 43.

Referring to FIG. 12E, a first alternative embodiment of the second exemplary memory opening fill structure 58 is illustrated, which can be derived from the second exemplary memory opening fill structure 58 illustrated in FIG. 12C by reacting the entire thickness of the vertical tubular portions of the second dielectric metal oxide layers 44 with the first dielectric metal oxide layer 53L. In this alternative embodiment, the second dielectric metal oxide layers 44 do not include tubular portions that laterally surround and contact a respective one of the discrete ferroelectric material portions 54.

Figure 13B:
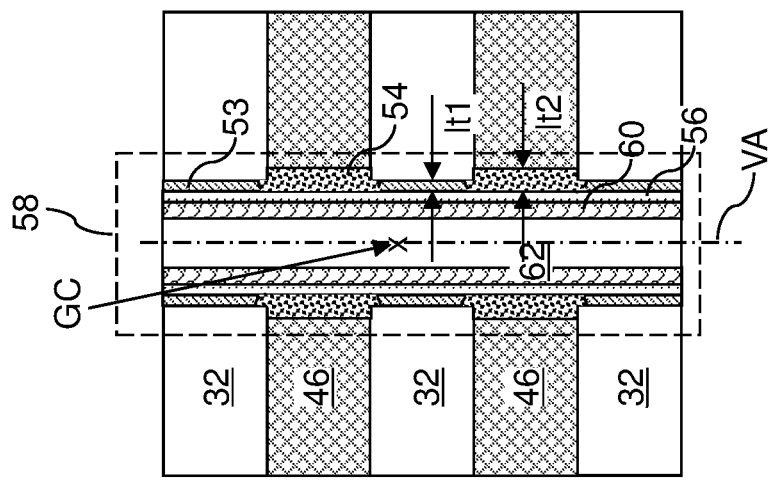
FIGS. 13A and 13B are sequential vertical cross-sectional views of a region of the first exemplary structure during formation of a second alternative embodiment of the second exemplary memory opening fill structure and electrically conductive layers according to the first embodiment of the present disclosure.
Figure 13A:
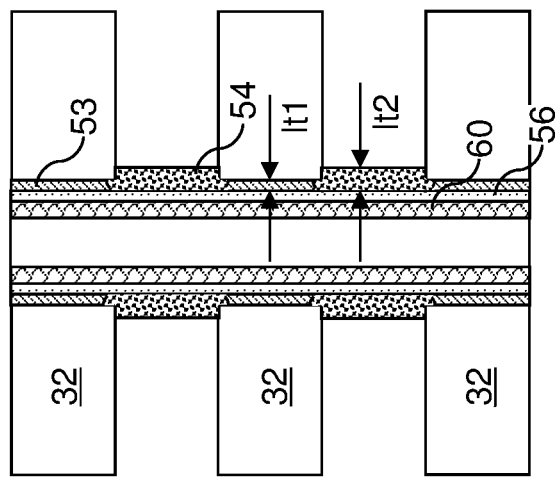

FIGS. 13A and 13B are sequential vertical cross-sectional views of a region of the first exemplary structure during formation of a second alternative embodiment of the second exemplary memory opening fill structure 58 and electrically conductive layers 46 according to the first embodiment of the present disclosure.

Referring to FIG. 13A, a structure for forming the second alternative embodiment of the second exemplary memory opening fill structure 58 can be derived from the second exemplary structure of FIG. 12C by removing the second dielectric metal oxide layer 44 selective to the material of the discrete ferroelectric material portions 54. The selective etching process discussed with reference to FIG. 11A may be employed. Horizontal top surfaces and horizontal bottom surfaces of the insulating layers 32 may be physically exposed upon removal of the second dielectric metal oxide layer 44.

Referring to FIG. 13B, the processing steps of FIG. 11B can be performed to form electrically conductive layers 46 in the backside recesses 43 around and directly on the vertical stacks of discrete ferroelectric material portions 54. The electrically conductive layers 46 are formed directly on horizontal surfaces of the insulating layers 32 and directly on outer sidewalls of the discrete ferroelectric material portions 54. The electrically conductive layers 46 are in direct contact with an outer sidewall of a respective one of the discrete ferroelectric material portions 54. In one embodiment, the entirety of the outer sidewall of each of the discrete ferroelectric material portions 54 may be in direct contact with a cylindrical sidewall of a respective one of the electrically conductive layers 46.

Figure 14:
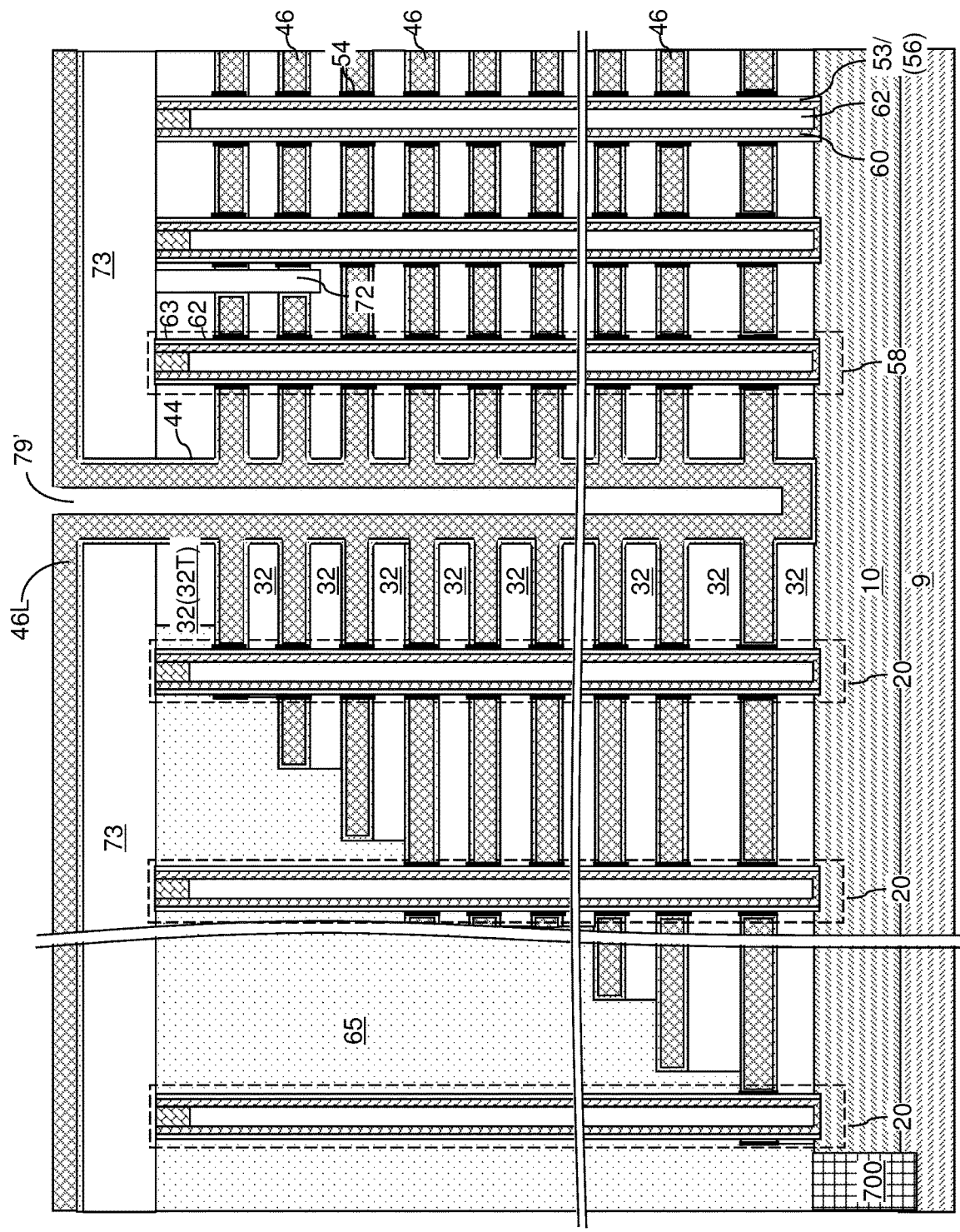
FIG. 14 is a vertical cross-sectional view of the first exemplary structure at a processing step that corresponds to any of the processing steps of FIGS. 10D, 10E, 11B, 12D, 12E, and 13B.

Referring to FIG. 14, the first exemplary structure is illustrated after formation of the electrically conductive layers 46, i.e., at a processing step that corresponds to any of the processing steps of FIG. 10D, 10E, 11B, 12D, 12E or 13B. A continuous electrically conductive material layer 46L comprising a same set of materials as the electrically conductive layers 46 is present over the contact-level dielectric layer 73 and on sidewalls of the backside trenches 79. A backside cavity 79' may be present in each unfilled volume of a respective one of the backside trenches 79.

Figure 15A:
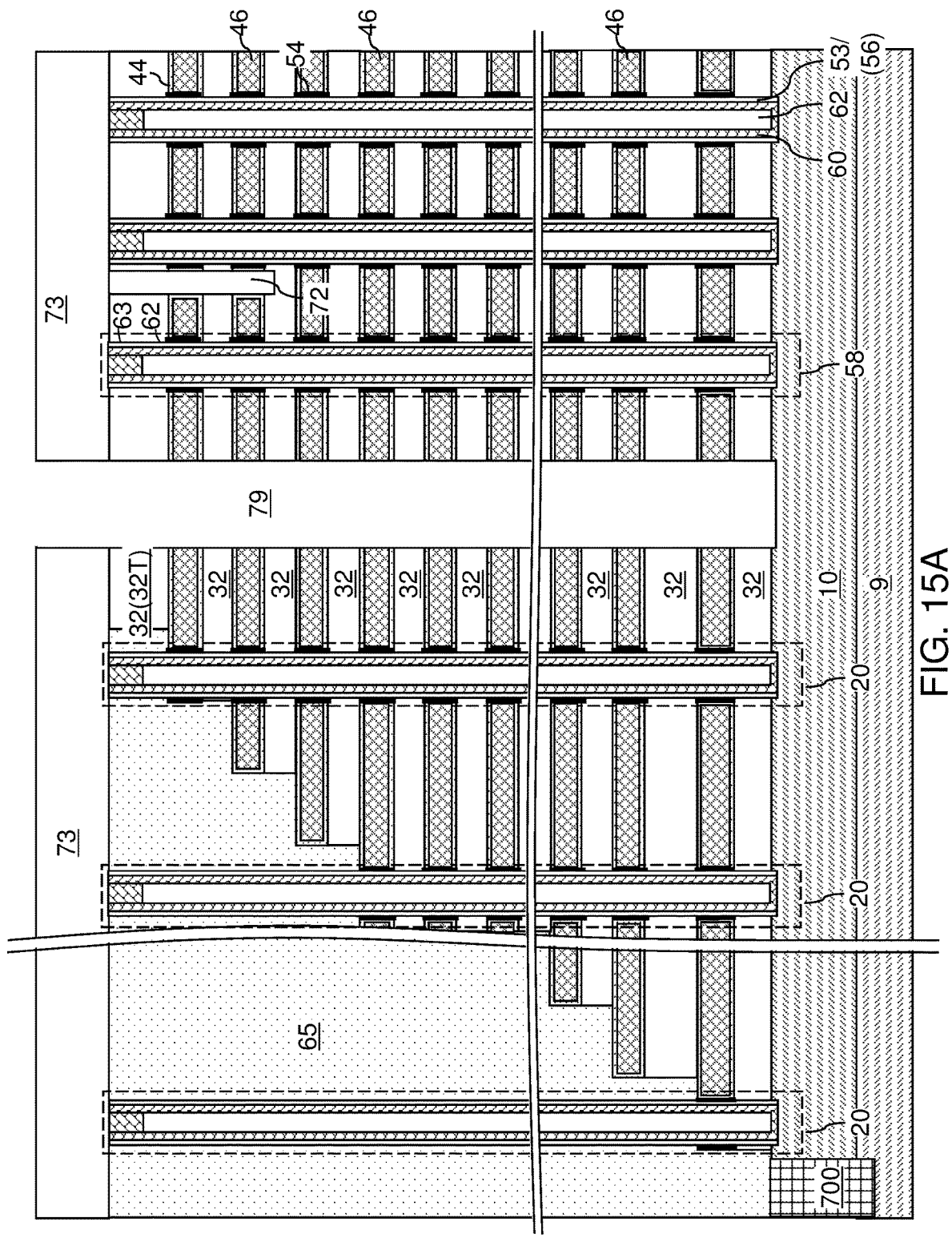
FIG. 15A is a schematic vertical cross-sectional view of the first exemplary structure after removal of a deposited conductive material from within the backside trench according to the first embodiment of the present disclosure.
Figure 15B:
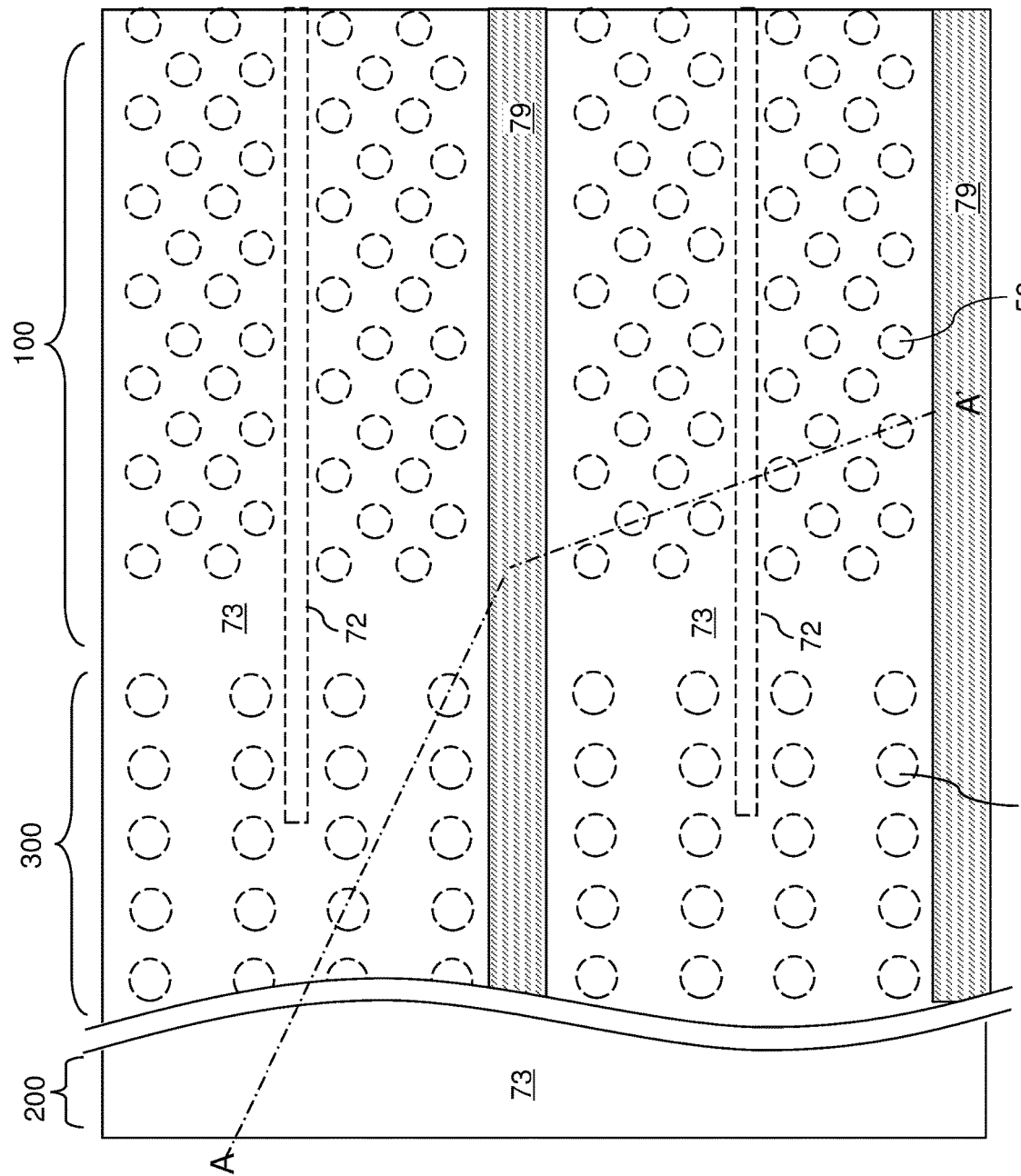
FIG. 15B is a partial see-through top-down view of the first exemplary structure of FIG. 15A. The vertical plane A-A' is the plane of the schematic vertical cross-sectional view of FIG. 15A.

Referring to FIGS. 15A and 15B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. In one embodiment, the removal of the continuous electrically conductive material layer 46L can be selective to the material of the second dielectric metal oxide layer 44 (if present). Alternatively, vertically-extending portions of the second dielectric metal oxide layer 44 may be removed from inside the backside trenches 79.

Figure 16:
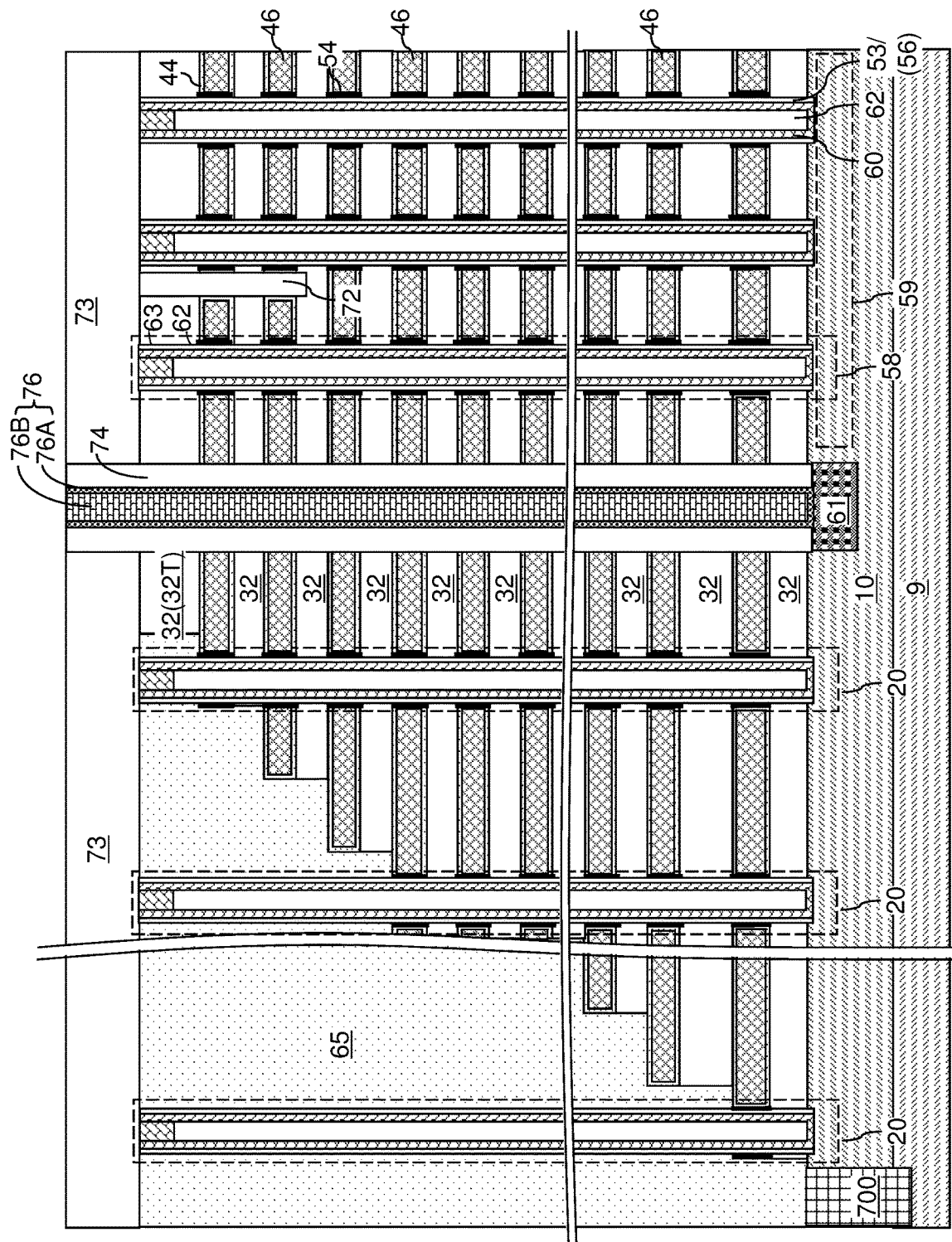
FIG. 16 is a schematic vertical cross-sectional view of the first exemplary structure after formation of a tubular insulating spacer and a backside contact structure according to the first embodiment of the present disclosure.

Referring to FIG. 16, a source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the vertical semiconductor channels 60 constitutes a horizontal semiconductor channel 59 for a plurality of field effect transistors.

An insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. In one embodiment, the insulating material layer can be formed directly on surfaces of the second dielectric metal oxide layers 44 and directly on the sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79. A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, MoN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61. If a second dielectric metal oxide layer 44 is employed, the backside contact via structure 76 can contact a sidewall of the second dielectric metal oxide layer 44.

Figure 17A:
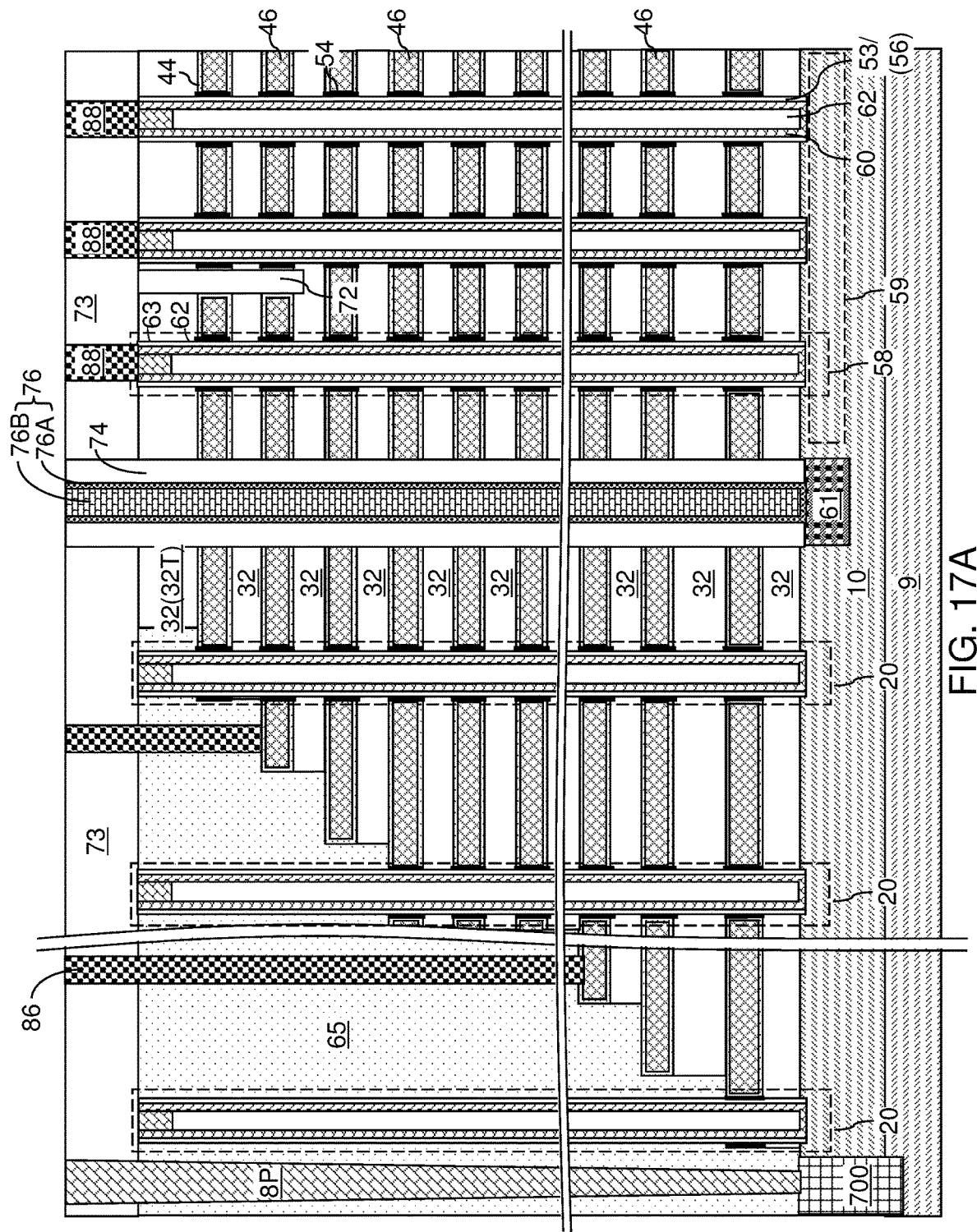
FIG. 17A is a schematic vertical cross-sectional view of the first exemplary structure after formation of additional contact via structures according to the first embodiment of the present disclosure.
Figure 17B:
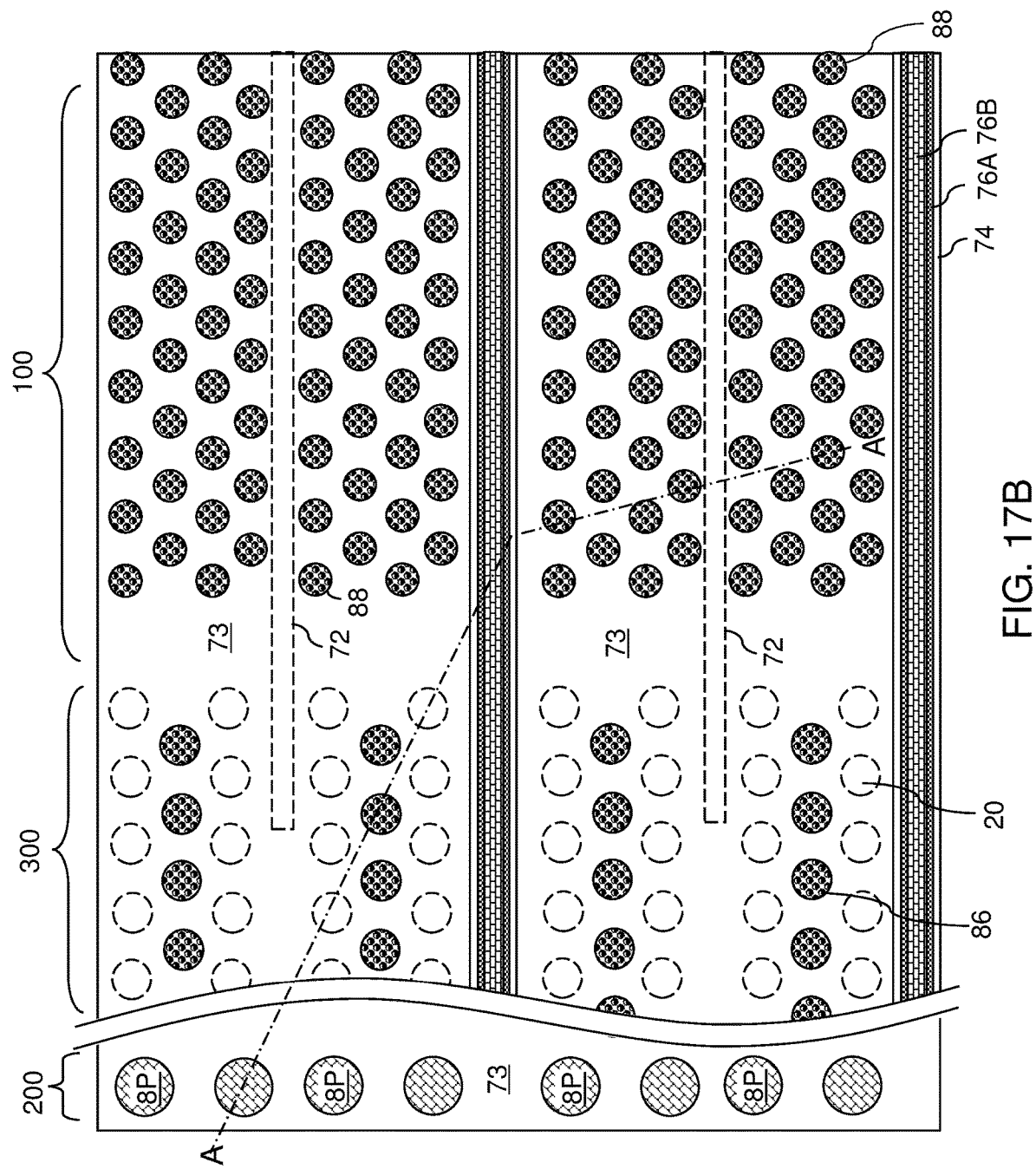
FIG. 17B is a top-down view of the first exemplary structure of FIG. 17A. The vertical plane A-A' is the plane of the schematic vertical cross-sectional view of FIG. 17A.

Referring to FIGS. 17A and 17B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Layer contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines (not shown) are then formed in electrical contact with the drain contact via structures 88.

In one alternative embodiment, the peripheral devices 700 are formed on a separate substrate and then bonded to the memory devices. In that case, the peripheral device contact via structures 8P may be omitted. In another alternative embodiment, the peripheral devices 700 may be formed underneath the alternating stack (32, 46). In that case, a horizontal source line may be provided in contact with a side of the vertical semiconductor channels 60 and the peripheral device contact via structures 8P may extend through the alternating stack (32, 46).

FIGS. 18A-18C are sequential vertical cross-sectional views of a region of a second exemplary structure during formation of an in-process memory opening fill structure 58 according to a second embodiment of the present disclosure.

Generally, the second exemplary structure can be derived from the first exemplary structure illustrated in FIGS. 4A and 4B by forming a metal oxide layer 153L on a sidewall of each of the memory openings 49 and the support openings 19. The metal oxide layer 153L may comprise and/or may consist essentially of any metal oxide material known in the art that is ferroelectric as-deposited or becomes ferroelectric when it becomes oxygen depleted and/or annealed into a ferroelectric crystal phase (e.g., orthorhombic crystal phase for hafnium oxide). For example, the metal oxide layer 153L comprises and/or consists essentially of hafnium oxide, zirconium oxide, aluminum oxide, hafnium zirconium oxide or aluminum doped hafnium oxide.

In one embodiment, the metal oxide layer 153L may comprise a ferroelectric metal oxide in as-deposited condition (e.g., as-deposited orthorhombic hafnium oxide). In this embodiment, the metal oxide layer 153L is deposited as ferroelectric metal oxide (e.g., ferroelectric hafnium and/or zirconium oxide) and includes a vertical stack of tubular portions 153, which are tubular ferroelectric material portions of the metal oxide layer 153L that are located at the levels of the sacrificial material layers 42.

In an alternative embodiment, the metal oxide layer 153L may comprise a non-ferroelectric metal oxide in the as-deposited condition, and is then converted to include ferroelectric portions. For example, the metal oxide layer 153L may comprise non-ferroelectric hafnium oxide having a monoclinic crystal phase, which is subsequently converted into a ferroelectric tetragonal and/or orthorhombic crystal phase by annealing and/or by stress induced by an applied voltage or current. In another example, the metal oxide layer 153L may comprise amorphous, stoichiometric aluminum oxide (i.e., $AlO_{1.5}$) which is converted to an amorphous ferroelectric oxygen depleted non-stoichiometric aluminum oxide (i.e., $AlO_{1.5-z}$, where z>0). In this embodiment, the tubular portions 153 are not ferroelectric.

The metal oxide layer 153L can be formed by a conformal deposition process such as a chemical vapor deposition process or an atomic layer deposition process. The thickness of the metal oxide layer 153L may be in a range from 1 nm to 20 nm, such as from 2 nm to 10 nm, although lesser and greater thicknesses may also be employed. A memory cavity 49' is present within an unfilled volume of each memory opening 49.

Referring to FIG. 18B, the processing steps of FIG. 5B may be performed to form a vertical semiconductor channel 60 in each memory opening 49.

Referring to FIG. 18C, the processing steps of FIG. 5C may be performed to form a dielectric core 62 in each memory opening 49.

Figure 19:
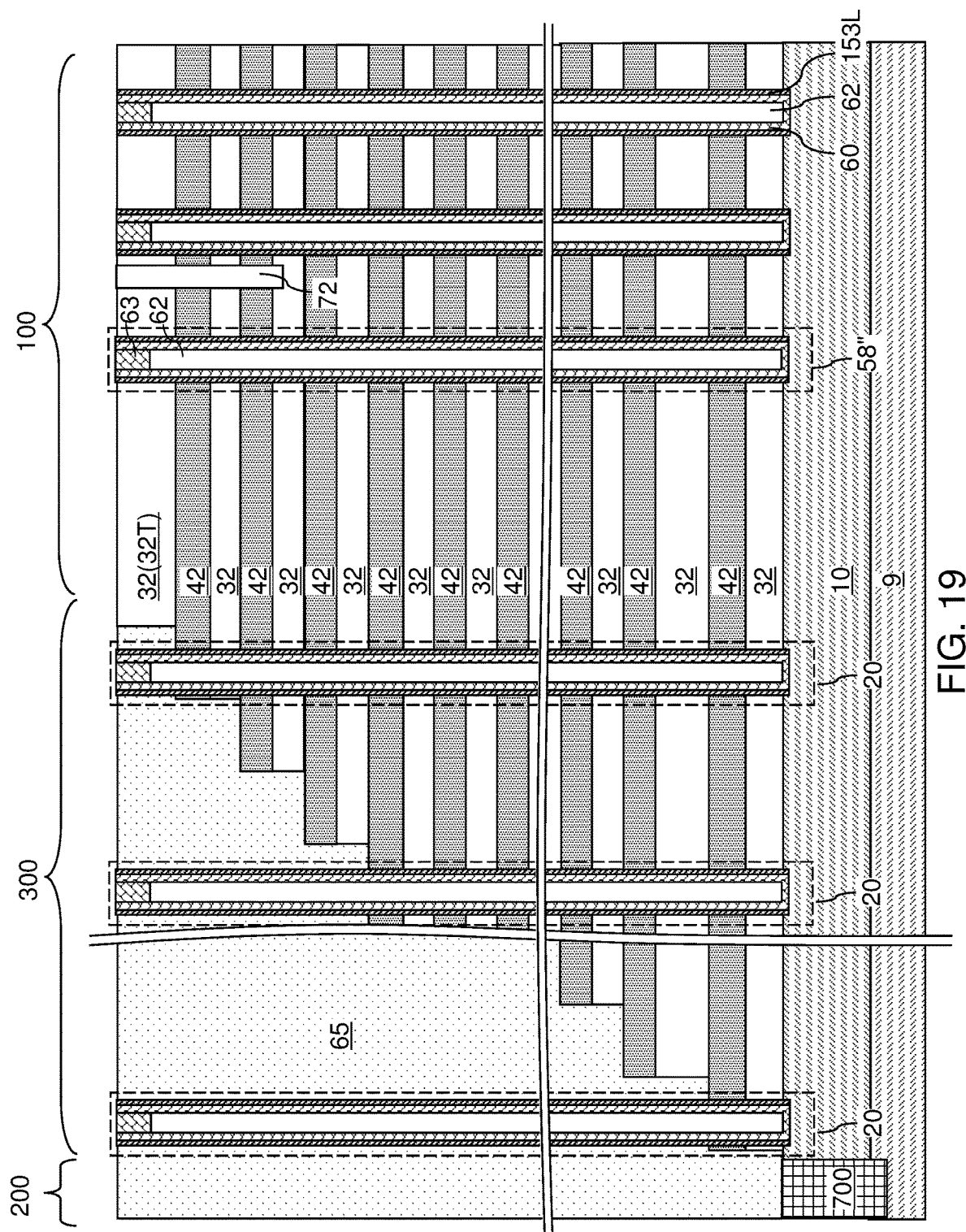
FIG. 19 is a schematic vertical cross-sectional view of the second exemplary structure after formation of in-process memory opening fill structures and support pillar structures according to the second embodiment of the present disclosure.

Referring to FIG. 19, the processing steps described with reference to FIG. 6 may be performed to form a drain region 63 within each memory opening 49. An in-process memory opening fill structure 58" can be formed in each of the memory openings 49. Each in-process memory opening fill structure 58" comprises the tubular portions 153 which are ferroelectric or non-ferroelectric, and are located at levels of the sacrificial material layers 42 and a vertical semiconductor channel 60 that is formed over the ferroelectric material portions. Support pillar structures 20 are formed in the support openings 19 at the same time as the in-process memory opening fill structures 58".

Figure 20:
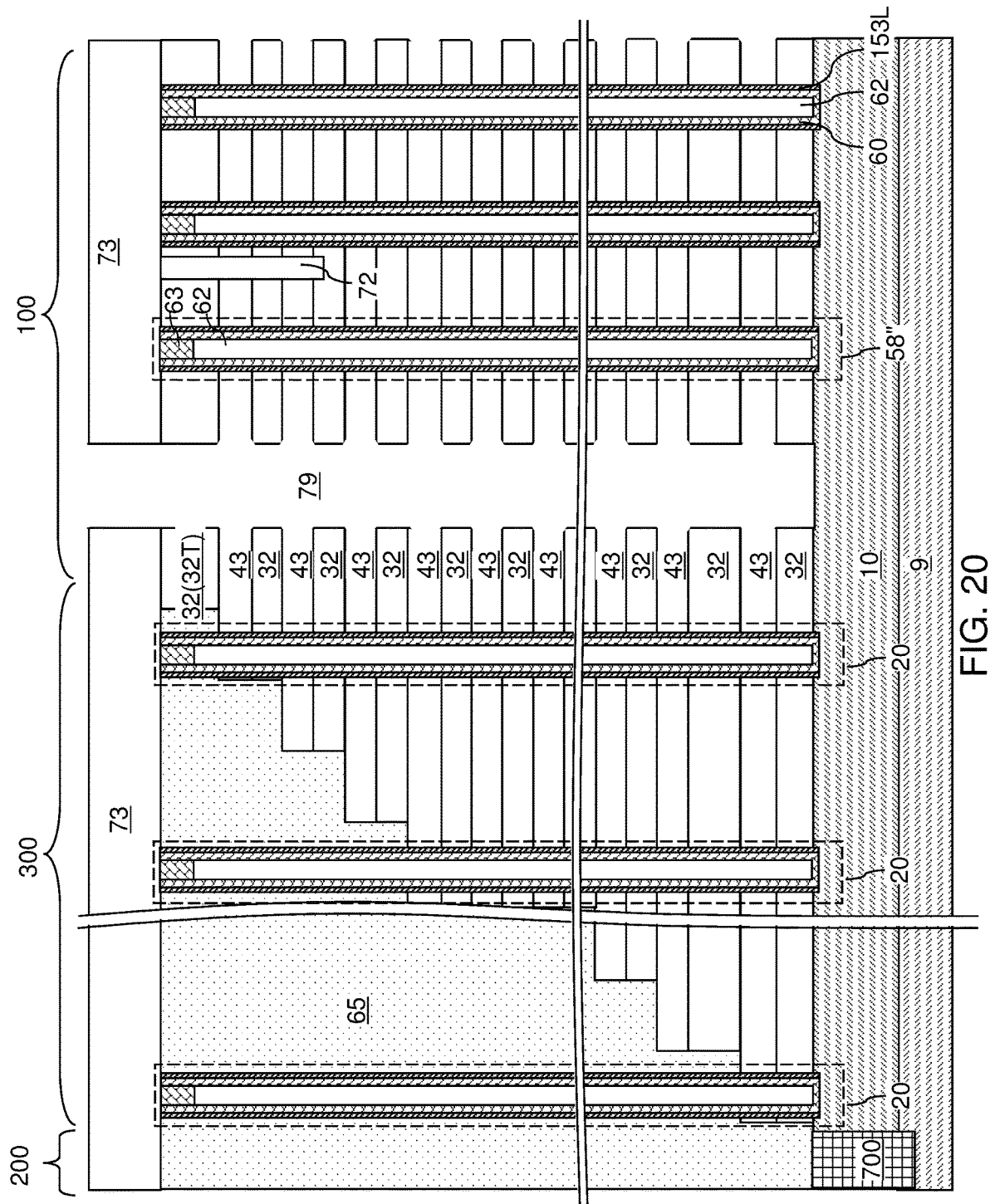
FIG. 20 is a schematic vertical cross-sectional view of the second exemplary structure after formation of a contact-level dielectric layer, backside trenches, and backside recesses according to the second embodiment of the present disclosure.
Figure 21A:
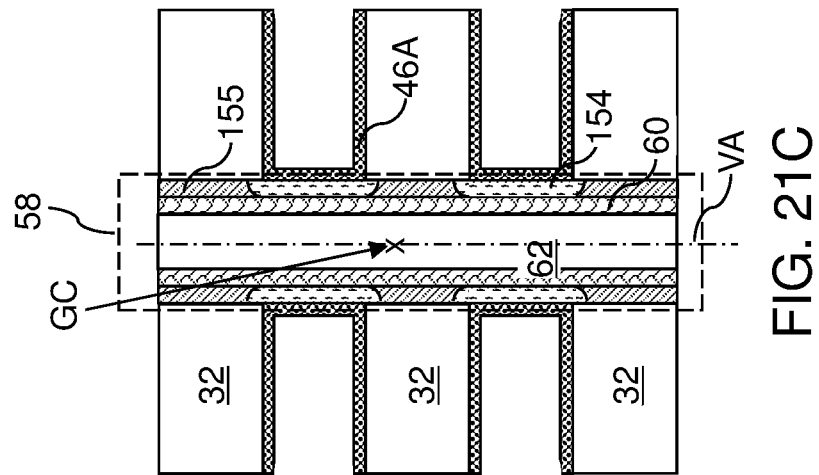
FIGS. 21A-21D are sequential vertical cross-sectional views of a region of the second exemplary structure during conversion of an in-process memory opening fill structure into a memory opening fill structure and formation of electrically conductive layers according to the second embodiment of the present disclosure.

Referring to FIGS. 20 and 21A, the processing steps described with reference to FIGS. 8A and 8B may be performed to form a contact-level dielectric layer 73 over the topmost insulating layer 32T, and to form backside trenches 79. The processing steps described with reference to FIG. 9 may be performed to remove the sacrificial material layers 42 selective to the materials of the insulating layers 32, the ferroelectric metal oxide layers 153L within the in-process memory opening fill structures 58", and the semiconductor material layer 10. Cylindrical surface segments of each outer sidewall of the ferroelectric metal oxide layers 153L can be physically exposed to the backside recesses.

Figure 21B:
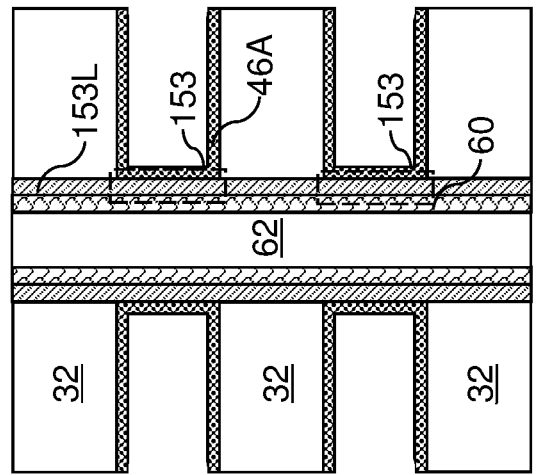

Referring to FIG. 21B an oxygen-gettering liner 46A can be conformally deposited in each of the backside recesses 43 and directly on an outer sidewall of each of the tubular portions 153 of the ferroelectric metal oxide layers 153L. In one embodiment, the oxygen-gettering liner 46A comprises a first electrically conductive material that getters oxygen atoms from the tubular portions 153, such as by diffusion of oxygen atoms from the tubular portions 153 into the oxygen-gettering liner 46A during an anneal (e.g., an anneal at a temperature of at least 350 degrees Celsius, such as 350 to 900 degrees Celsius). The oxygen-gettering liner 46A may be formed directly on horizontal surfaces of the insulating layers 32 of the alternating stack (32, 46) and directly on cylindrical surface segments of outer sidewalls of the ferroelectric metal oxide layers 153L.

In one embodiment, the oxygen-gettering liner 46A may comprise an electrically conductive metal or metal nitride material, such as platinum, titanium, tantalum, hafnium, aluminum, TaN or TiN. The oxygen-gettering liner 46A may be deposited by a conformal deposition process, such as a chemical vapor deposition process or an atomic layer deposition process. The thickness of the oxygen-gettering liner 46A may be in a range from 2 nm to 20 nm, such as from 4 nm to 10 nm, although lesser and greater thicknesses may also be employed.

Figure 21C:
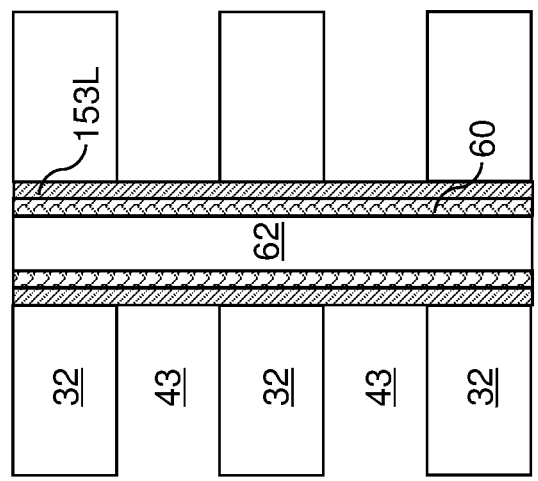

Referring to FIG. 21C, the oxygen-gettering first material of the oxygen-gettering liner 46A getters oxygen atoms from the tubular portions 153, and converts them into a vertical stack of discrete non-stoichiometric oxygen-deficient ferroelectric material portions 154. Optionally, an anneal at a temperature of at least 350 degrees Celsius, such as 350 to 900 degrees Celsius may be carried out to enhance the diffusion of oxygen atoms from the tubular portions 153 to the oxygen-gettering liner 46A, and to generate oxygen vacancies in the tubular portions 153. In this case, the tubular portions 153 of each ferroelectric metal oxide layers 153L located at the levels of the backside recesses 43 are converted into the discrete non-stoichiometric oxygen-deficient ferroelectric material portions 154.

In one embodiment, each of the discrete non-stoichiometric oxygen-deficient ferroelectric material portions 154 has a radial oxygen concentration gradient such that an atomic percentage of oxygen atoms decreases with a radial distance from a vertical axis VA passing through a geometrical center GC of the memory opening fill structure 58.

Portions of each metal oxide layers 153L that are not converted into the discrete non-stoichiometric oxygen-deficient ferroelectric material portions 154 comprise a vertical stack of discrete spacer material portions 155. In other words, portions the metal oxide layer 153L located at levels of the insulating layers 32 comprise dielectric spacer material portions 155 after formation of the vertical stack of discrete non-stoichiometric oxygen-deficient ferroelectric material portions 154. The dielectric spacer material portions 155 may comprise a stoichiometric metal oxide material which is either ferroelectric or non-ferroelectric. For example, if the metal oxide layer 153L is ferroelectric (e.g., it comprises ferroelectric hafnium and/or zirconium oxide) then the dielectric spacer material portions 155 are ferroelectric (i.e., comprise dielectric spacer ferroelectric material portions). In contrast, if the metal oxide layer 153L is non-ferroelectric (e.g., it comprises amorphous stoichiometric aluminum oxide), then the dielectric spacer material portions 155 are non-ferroelectric metal oxide material portions.

The vertical stack of discrete spacer material portions 155 is interlaced with the vertical stack of discrete non-stoichiometric oxygen-deficient ferroelectric material portions 154 along a vertical direction. In one embodiment, the discrete spacer material portions 155 have a material composition that differs from a material composition of the discrete non-stoichiometric oxygen-deficient ferroelectric material portions 154 by a reduced density of oxygen vacancies.

In one embodiment, the discrete spacer material portions 155 have a first average density of oxygen vacancies, the discrete non-stoichiometric oxygen-deficient ferroelectric material portions 154 have a second average density of oxygen vacancies that is greater than the first average density. In one embodiment, a ratio of the second average density of oxygen vacancies to the first average density of oxygen vacancies is at least 1.2, and/or at least 2.0, and/or at least 3.0, and/or at least 10, and/or at least 100. In one embodiment, the atomic concentration of oxygen vacancies in the discrete non-stoichiometric oxygen-deficient ferroelectric material portions 154 may be in a range from $1.0 \times 10^{15}/cm^3$ to $1.0 \times 10^{20}/cm^3$, such as from $1.0 \times 10^{17}/cm^3$ to $1.0 \times 10^{19}/cm^3$, although lesser and greater atomic concentration of oxygen vacancies may also be employed.

In one embodiment, the non-stoichiometric oxygen-deficient ferroelectric material portions 154 comprise non-stoichiometric oxygen-deficient ferroelectric hafnium oxide portions having an orthorhombic crystal structure and a formula $HfO_{2-x}$, where x>0. For example, $1.0 \times 10^{15}/cm^3 \le x \le 1.0 \times 10^{20}/cm^3$. In another embodiment, the non-stoichiometric oxygen-deficient ferroelectric material portions 154 comprise non-stoichiometric oxygen-deficient ferroelectric zirconium oxide portions having a formula $ZrO_{2-y}$, where y>0. For example, $1.0 \times 10^{15}/cm^3 \le y \le 1.0 \times 10^{20}/cm^3$. In another embodiment, the non-stoichiometric oxygen-deficient ferroelectric material portions 154 comprise non-stoichiometric oxygen-deficient ferroelectric aluminum oxide portions having a formula $AlO_{1.5-y}$, where y>0. For example, $1.0 \times 10^{15}/cm^3 \le y \le 1.0 \times 10^{20}/cm^3$. The aluminum oxide portions may be crystalline or amorphous.

In one embodiment, the discrete spacer material portions 155 comprise stoichiometric ferroelectric hafnium oxide portions having an orthorhombic crystal structure and a formula $HfO_2$. In another embodiment, the discrete spacer material portions 155 comprise stoichiometric ferroelectric zirconium oxide portions having a formula $ZrO_2$. In another embodiment, the discrete spacer material portions 155 comprise non-ferroelectric stoichiometric aluminum oxide portions having a formula $AlO_{1.5}$.

Each combination of a vertical stack of discrete non-stoichiometric oxygen-deficient ferroelectric material portions 154, a vertical stack of discrete spacer material portions 155, a vertical semiconductor channel 60, a dielectric core 62, and a drain region 63 that is formed within a respective memory opening 49 constitutes a memory opening fill structure 58. Thus, each in-process memory opening fill structure 58" is converted into a memory opening fill structure 58 upon replacement of each metal oxide layer 153L with a combination of a vertical stack of discrete non-stoichiometric oxygen-deficient ferroelectric material portions 154 and a vertical stack of discrete spacer material portions 155.

In one embodiment, outer sidewalls of the vertical stack of discrete spacer material portions 155 are vertically coincident with outer sidewalls of the vertical stack of discrete non-stoichiometric oxygen-deficient ferroelectric material portions 154 within each memory opening fill structure 58. In one embodiment, inner sidewalls of the vertical stack of discrete spacer material portions 155 are vertically coincident with inner sidewalls of the vertical stack of discrete non-stoichiometric oxygen-deficient ferroelectric material portions 154 within each memory opening fill structure 58.

Figure 21D:
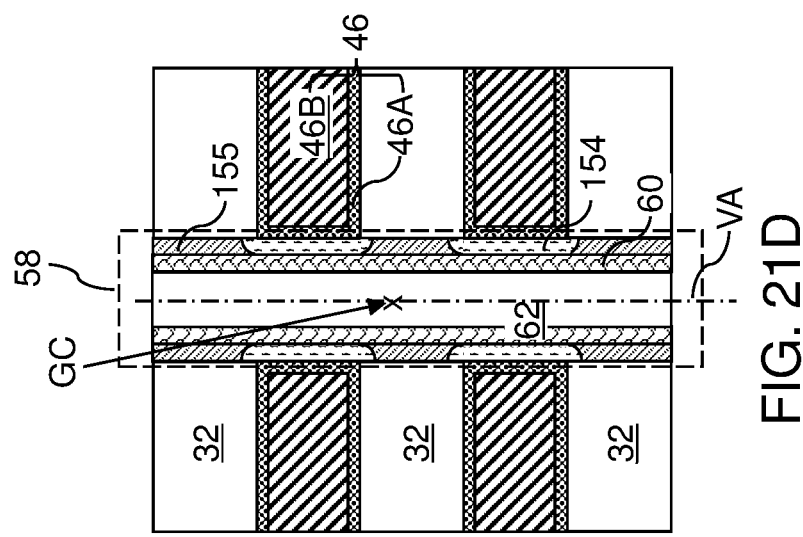

Referring to FIG. 21D, a conductive fill material layer 46B comprising and/or consisting essentially of a second conductive material can be formed on a respective oxygen-gettering liner 46A in each remaining volume of the backside recesses 43. The second conductive material is different from the first conductive material. In one embodiment, the second conductive material comprises and/or consists essentially of a metal such as tungsten, ruthenium, cobalt or molybdenum, and may have a higher electrical conductivity than the first conductive material. Each contiguous combination of a portion of the oxygen-gettering liner 46A and a portion of the conductive fill material layer 46B that fills a respective backside recess 43 constitutes an electrically conductive layer 46.

Generally, oxygen-depleted non-stochiometric metal oxide materials may display higher electrical polarization due to stronger ferroelectric phase formation and may stabilize the ferroelectric phase (e.g., the orthorhombic phase for hafnium oxide). The oxygen-depleted non-stochiometric ferroelectric metal oxide materials provide many advantages for the purpose of use in a ferroelectric memory device. Such oxygen-depleted non-stochiometric ferroelectric metal oxide materials may be employed as undoped materials in which careful dopant concentration adjustment is not needed. Further, such oxygen-depleted non-stochiometric ferroelectric metal oxide materials do not require phase engineering, and may even be employed as microcrystalline or amorphous materials in some applications (e.g., as amorphous oxygen-depleted aluminum oxide). Such oxygen-depleted non-stochiometric ferroelectric metal oxide materials have low leakage current even for thicknesses less than 5 nm. Generally, such oxygen-depleted non-stochiometric ferroelectric metal oxide materials do not induce grain boundary leakage due to amorphous or highly textured nature. Such oxygen-depleted non-stochiometric ferroelectric metal oxide materials may be operated with lower switching voltages, and thus, with low power consumption, compared to non-oxygen-depleted ferroelectric materials. Further, depleted layers can be easily formed within such oxygen-depleted non-stochiometric ferroelectric metal oxide materials using oxygen gettering control gate electrodes, which are capable of removing oxygen atoms from the oxygen-depleted non-stochiometric ferroelectric metal oxide materials.

According to an aspect of the present disclosure, discrete portions of an oxygen-depleted non-stochiometric ferroelectric metal oxide material can be formed using the oxygen-gettering liner 46A. The discrete non-stoichiometric oxygen-deficient ferroelectric material portions 154 may provide improved scalability, lower power consumption, faster switching, higher endurance, and/or easier integration compared to stoichiometric ferroelectric material portions.

Further, thermodynamic calculations indicate that oxygen vacancies lower energy of formation for ferroelectric orthorhombic and tetragonal ferroelectric phases from the more stable non-ferroelectric monoclinic phase for many ferroelectric metal oxide materials. As a result, highly polarizable discrete non-stoichiometric oxygen-deficient ferroelectric material portions 154 may be formed, which provide larger memory windows and lower power operation.

Formation of the discrete non-stoichiometric oxygen-deficient ferroelectric material portions 154 of the second embodiment present disclosure does not require (but also does not preclude) use of any dopants (e.g., Al, Si or Zr dopants in orthorhombic hafnium oxide). Oxygen vacancies can cause undoped films of hafnium oxide or zirconium oxide (which may be non-ferroelectric) to exhibit ferroelectric behavior. As such, precise dopant control is not necessary. Further, even amorphous materials (which are not normally ferroelectric) may exhibit ferroelectric behavior due to oxygen deficiency. In such cases, precise phase control of the material of the discrete non-stoichiometric oxygen-deficient ferroelectric material portions 154 may be unnecessary. Thus, the discrete non-stoichiometric oxygen-deficient ferroelectric material portions 154 can provide robust ferroelectric films with a wide process window and improved performance over conventional ferroelectric materials.

Figure 22A:
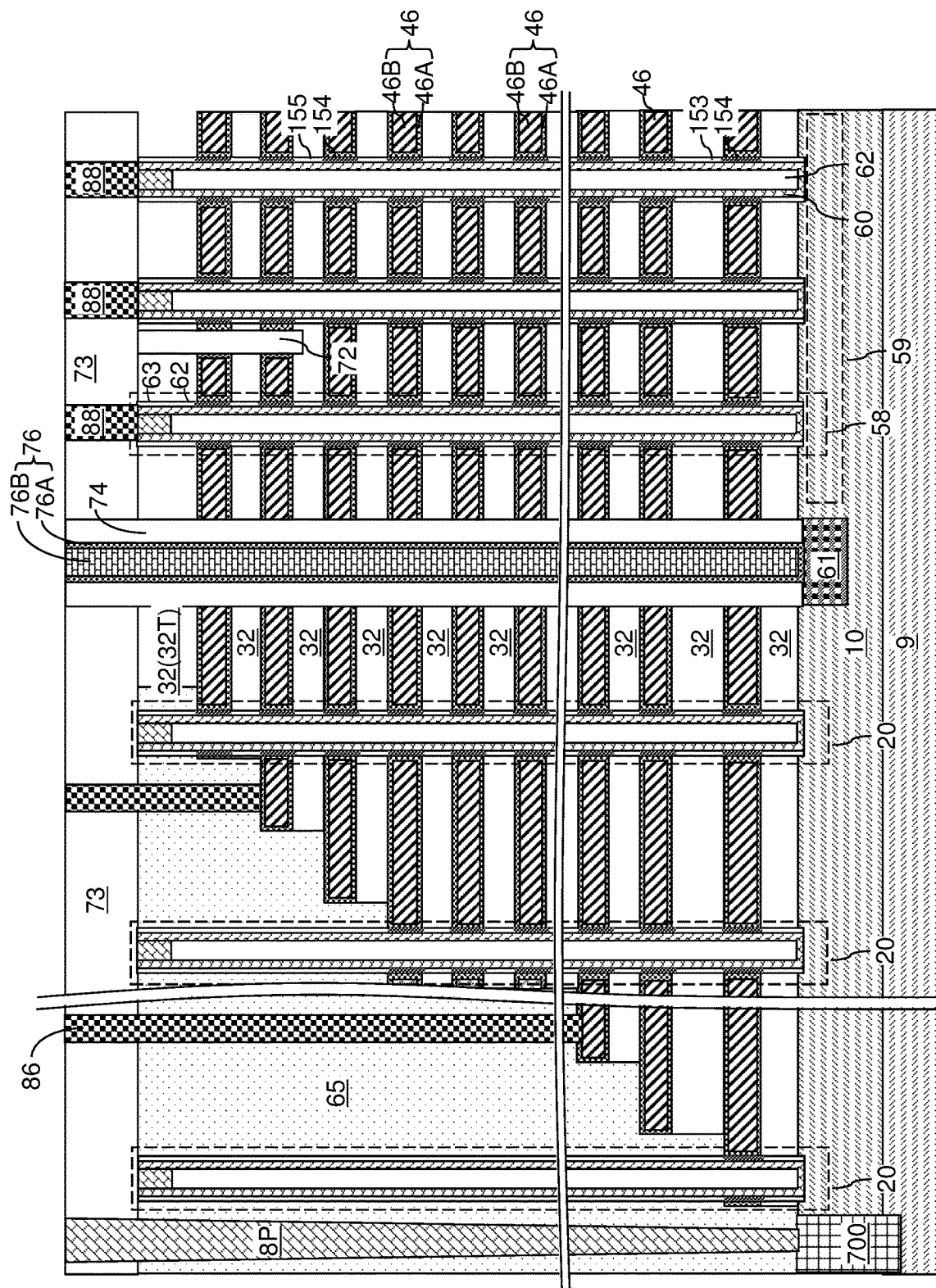
FIG. 22A is a vertical cross-sectional view of a first configuration of the second exemplary structure after formation of electrically conductive layers and various contact via structures according to the second embodiment of the present disclosure.
Figure 22B:
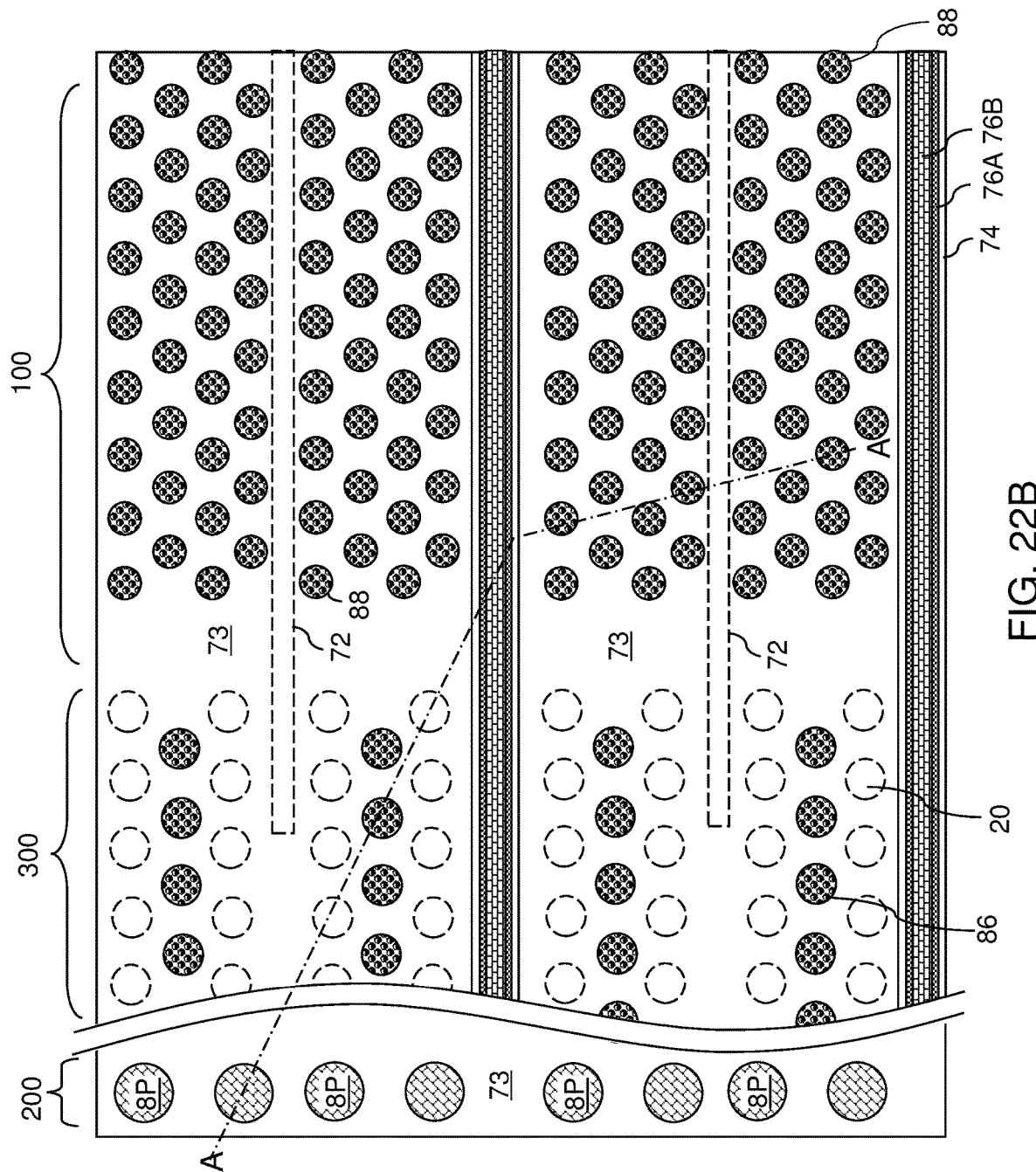
FIG. 22B is a top-down view of the first exemplary structure of FIG. 22A. The vertical plane A-A' is the plane of the schematic vertical cross-sectional view of FIG. 22A.

Referring to FIGS. 22A-22B, the processing steps described with reference to FIGS. 15A and 15B may be performed to remove the electrically conductive layers 46 from inside the backside trenches 79 and from above the top surface of the contact-level dielectric layer 73. The processing steps described with reference to FIG. 16 may be performed to form an insulating spacer 74 and a backside contact via structure 76 within each backside trench 79. The processing steps described with reference to FIGS. 17A and 17B may be performed to form various contact via structures (88, 86, 8P). The contact via structures (88, 86, 8P) may comprise drain contact via structures 88 that are formed through the contact-level dielectric layer 73 directly on a respective one of the memory opening fill structures 58. The drain contact via structures 88 are electrically connected to an upper end of a respective vertical semiconductor channel 60.

FIGS. 23A-23F are sequential vertical cross-sectional views of a region of a third exemplary structure during formation of an in-process memory opening fill structure according to a third embodiment of the present disclosure.

Figure 23A:
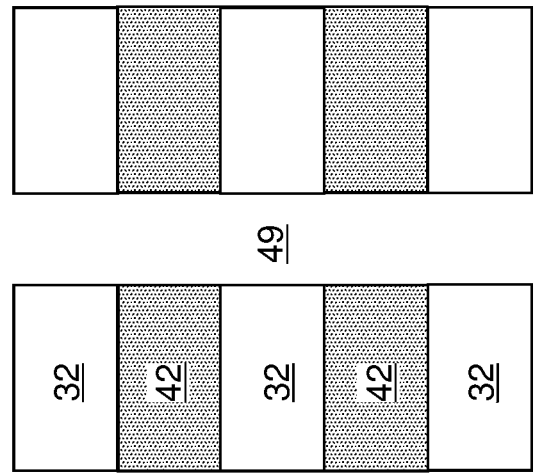
FIGS. 23A-23F are sequential vertical cross-sectional views of a region of a third exemplary structure during formation of an in-process memory opening fill structure according to a third embodiment of the present disclosure.

Referring to FIG. 23A, a memory opening 49 in a third exemplary structure is illustrated. Generally, the third exemplary structure at the processing step of FIG. 23A may be the same as the first exemplary structure illustrated in FIGS. 4A and 4B.

Figure 23B:
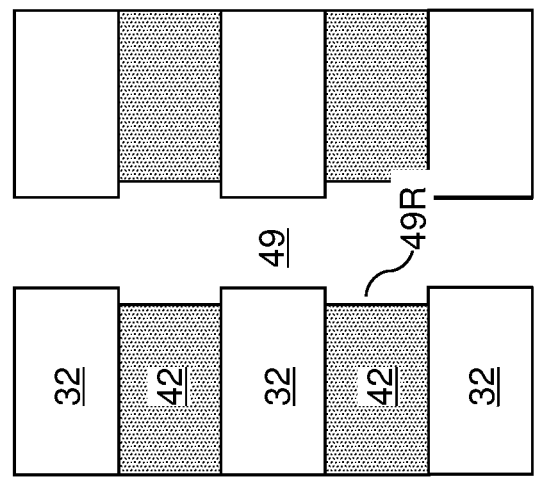

Referring to FIG. 23B, a selective isotropic etch process can be performed to laterally recess sidewalls of the sacrificial material layers 42 relative to sidewalls of the insulating layers 32 around each memory opening. Each volume from which a cylindrical material portion of a sacrificial material layer 42 is removed is herein referred to as an annular recess 49R. Annular recesses 49R are formed at levels of the sacrificial material layers 42 around each memory opening 49. Each memory opening 49 as expanded by the selective isotropic etch process may include a respective vertical stack of annular recesses 49R. In an illustrative example, the insulating layers 32 may comprise silicon oxide and the sacrificial material layers 42 may comprises silicon nitride, and the selective isotropic etch process may comprise a wet etch process using hot phosphoric acid. The duration of the selective isotropic etch process may be selected such that the lateral recess distance is the same as a target lateral thickness of ferroelectric material portions to be subsequently formed. For example, the lateral recess distance of the selective isotropic etch process may be in a range from 1 nm to 20 nm, such as from 2 nm to 10 nm, although lesser and greater lateral recess distances may also be employed.

Figure 23C:
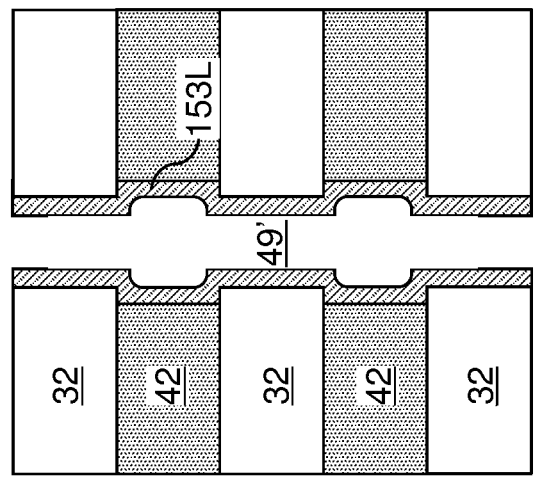

Referring to FIG. 23C, the metal oxide layer 153L described above can be conformally deposited on sidewalls of the memory openings 49 and the support openings 19. The metal oxide layer 153L can be formed by a conformal deposition process such as a chemical vapor deposition process or an atomic layer deposition process. Each physically exposed inner sidewall of the ferroelectric meal oxide layer 153L may have lateral undulations. The thickness of the metal oxide layer 153L may be the same as or may be greater than the lateral recess 49R width formed by the selective isotropic etch process. In one embodiment, the thickness of the metal oxide layer 153L may be in a range from 1 nm to 30 nm, such as from 2 nm to 20 nm, although lesser and greater thicknesses may also be employed. A memory cavity 49' is present within an unfilled volume of each memory opening 49.

Figure 23F:
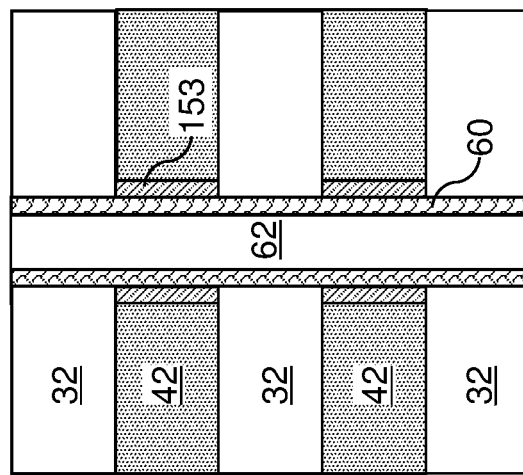
Figure 23E:
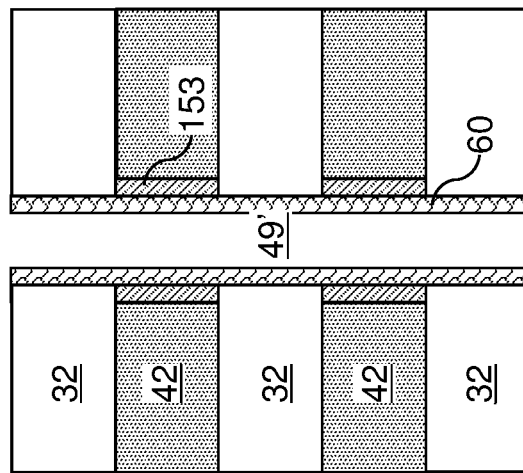
Figure 23D:
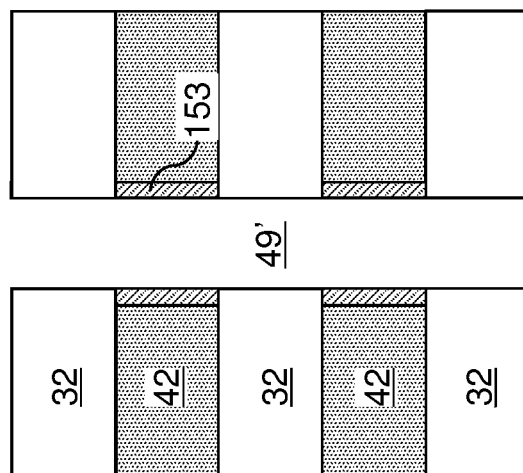

Referring to FIG. 23D, an anisotropic etch process can be performed to etch portions of the metal oxide layer 153L that are not masked by an overlying structure, such as an overlying insulating layer 32. Portions of the metal oxide layer 153L located outside the annular recesses can be removed by the anisotropic etch process. Remaining portions of the metal oxide layer 153L that remain within each memory opening 49 comprise a vertical stack of tubular portions 153 of the metal oxide layer 153L that are located at the levels of the sacrificial material layers 42. The tubular portions 153 may be ferroelectric or non-ferroelectric and are vertically spaced from each other by the insulating layers 32. In one embodiment, inner cylindrical sidewalls of the tubular portions 153 may be vertically coincident with cylindrical sidewalls of the insulating layers 32 around each memory opening 49.

Referring to FIG. 23E, the processing steps of FIG. 5B may be performed to form a vertical semiconductor channel 60 in each memory opening 49. Each vertical semiconductor channel 60 can be formed directly on inner sidewalls of a vertical stack of tubular portions 153 and directly on sidewalls of the insulating layers 32 within a respective memory opening 49.

Referring to FIG. 23F, the processing steps of FIG. 5C may be performed to form a dielectric core 62 in each memory opening 49.

Figure 24:
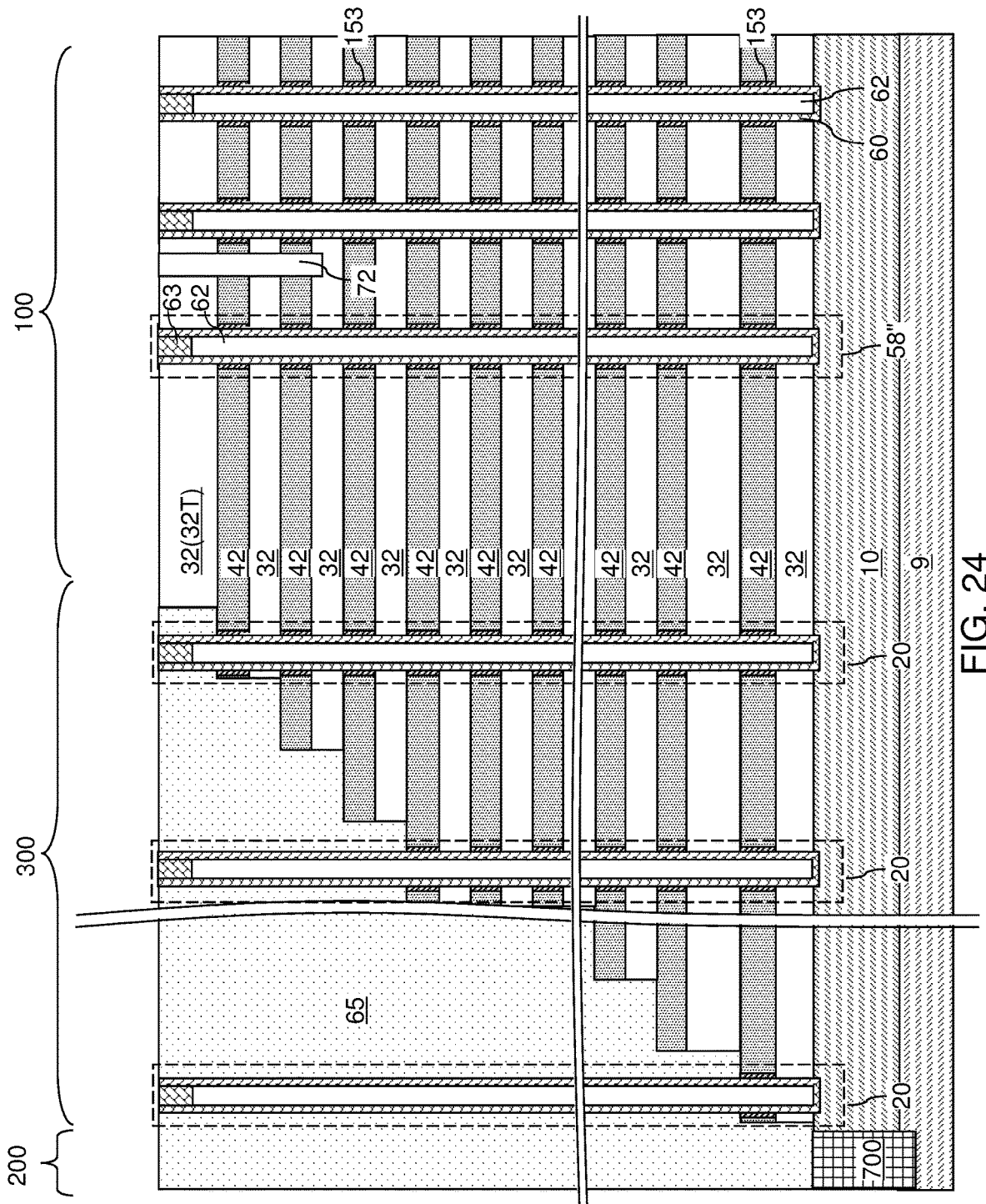
FIG. 24 is a schematic vertical cross-sectional view of the third exemplary structure after formation of in-process memory opening fill structures and support pillar structures according to the third embodiment of the present disclosure.

Referring to FIG. 24, the processing steps described with reference to FIG. 6 may be performed to form a drain region 63 within each memory opening 49. An in-process memory opening fill structure 58" can be formed in each of the memory openings 49. Each in-process memory opening fill structure 58 comprises the tubular portions 153 located at levels of the sacrificial material layers 42 and a vertical semiconductor channel 60 that is formed over, and within, the ferroelectric material portions. Support pillar structures 20 are formed in the support openings 19.

Figure 25:
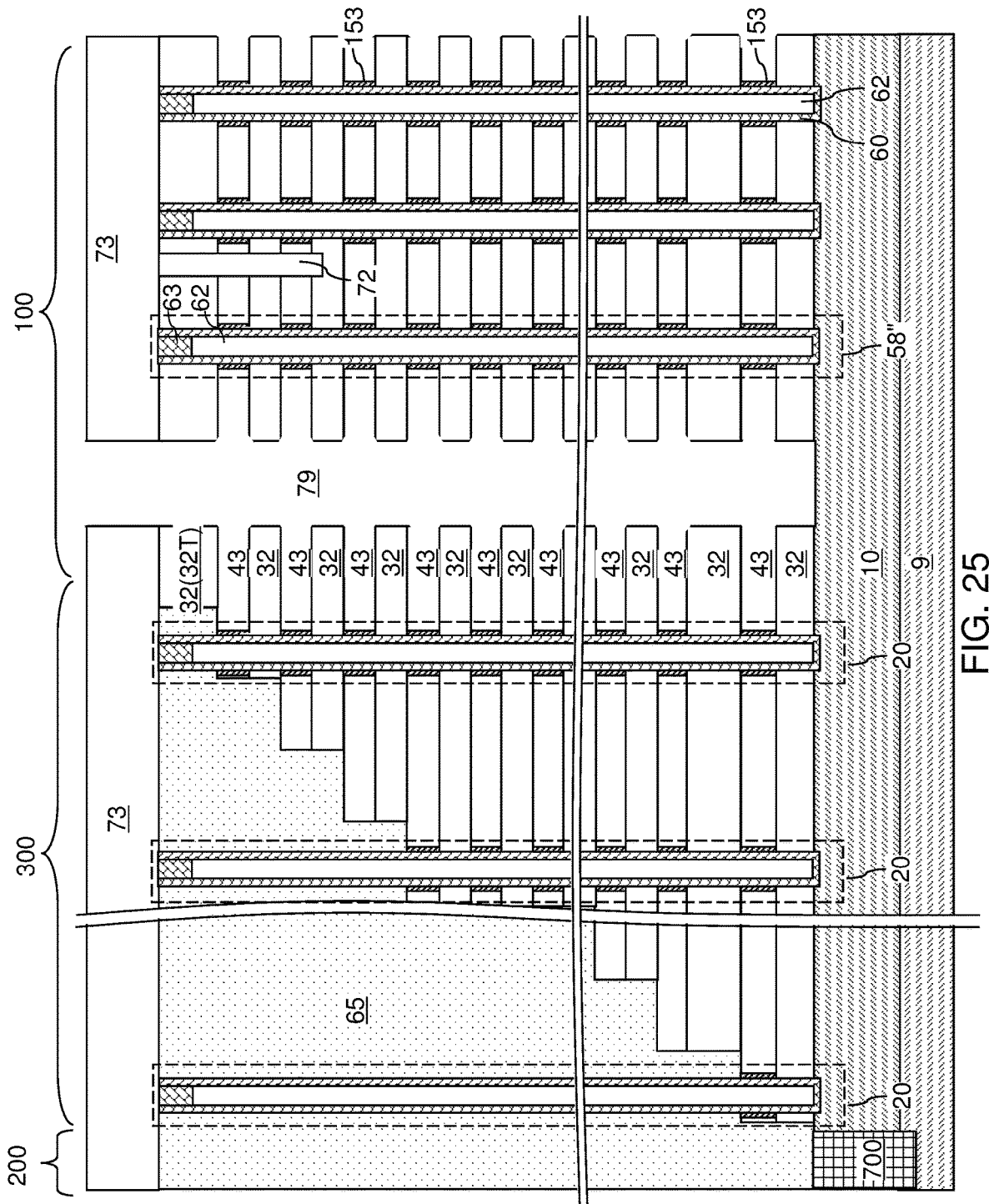
FIG. 25 is a schematic vertical cross-sectional view of the third exemplary structure after formation of a contact-level dielectric layer, backside trenches, and backside recesses according to the third embodiment of the present disclosure.

Referring to FIGS. 25 and 26A, the processing steps described with reference to FIGS. 8A and 8B may be performed to form a contact-level dielectric layer 73 over the topmost insulating layer 32T, and to form backside trenches 79. The processing steps described with reference to FIG. 9 may be performed to remove the sacrificial material layers 42 selective to the materials of the insulating layers 32, the tubular portions 153 within the in-process memory opening fill structures 58", and the semiconductor material layer 10. Cylindrical outer sidewalls of the tubular portions 153 can be physically exposed to the backside recesses 43.

Referring to FIG. 26B, the oxygen-gettering liner 46A is conformally deposited in each of the backside recesses 43 and directly on an outer sidewall of each of the tubular portions 153, as described above with respect to FIG. 21B. The processing steps described with reference to FIG. 21B may be employed to form the oxygen-gettering liner 46A. The oxygen-gettering liner 46A may have the same material composition as, and may have the same thickness range as, the oxygen-gettering liner 46A in the second exemplary structure described with reference to FIG. 21B.

Referring to FIG. 26C, the oxygen-gettering liner 46A getters oxygen atoms from the tubular portions 153, and converts them into a vertical stack of discrete non-stoichiometric oxygen-deficient ferroelectric material portions 154, as described above with respect to FIG. 21C. In one embodiment, each of the discrete non-stoichiometric oxygen-deficient ferroelectric material portions 154 has a radial oxygen concentration gradient such that an atomic percentage of oxygen atoms decreases with a radial distance from a vertical axis VA passing through a geometrical center GC of the memory opening fill structure 58.

Each combination of a vertical stack of discrete non-stoichiometric oxygen-deficient ferroelectric material portions 154, a vertical semiconductor channel 60, a dielectric core 62, and a drain region 63 that is formed within a respective memory opening 49 constitutes a memory opening fill structure 58. Thus, each in-process memory opening fill structure 58" is converted into a memory opening fill structure 58 upon conversion of the tubular portions 153 into the vertical stack of discrete non-stoichiometric oxygen-deficient ferroelectric material portions 154.

Referring to FIG. 26D, the above-described conductive fill material layer 46B is formed on a respective oxygen-gettering liner 46A in each remaining volume of the backside recesses 43. Each contiguous combination of a portion of the oxygen-gettering liner 46A and a portion of the conductive fill material layer 46B that fills a respective backside recess 43 constitutes an electrically conductive layer 46.

Figure 27A:
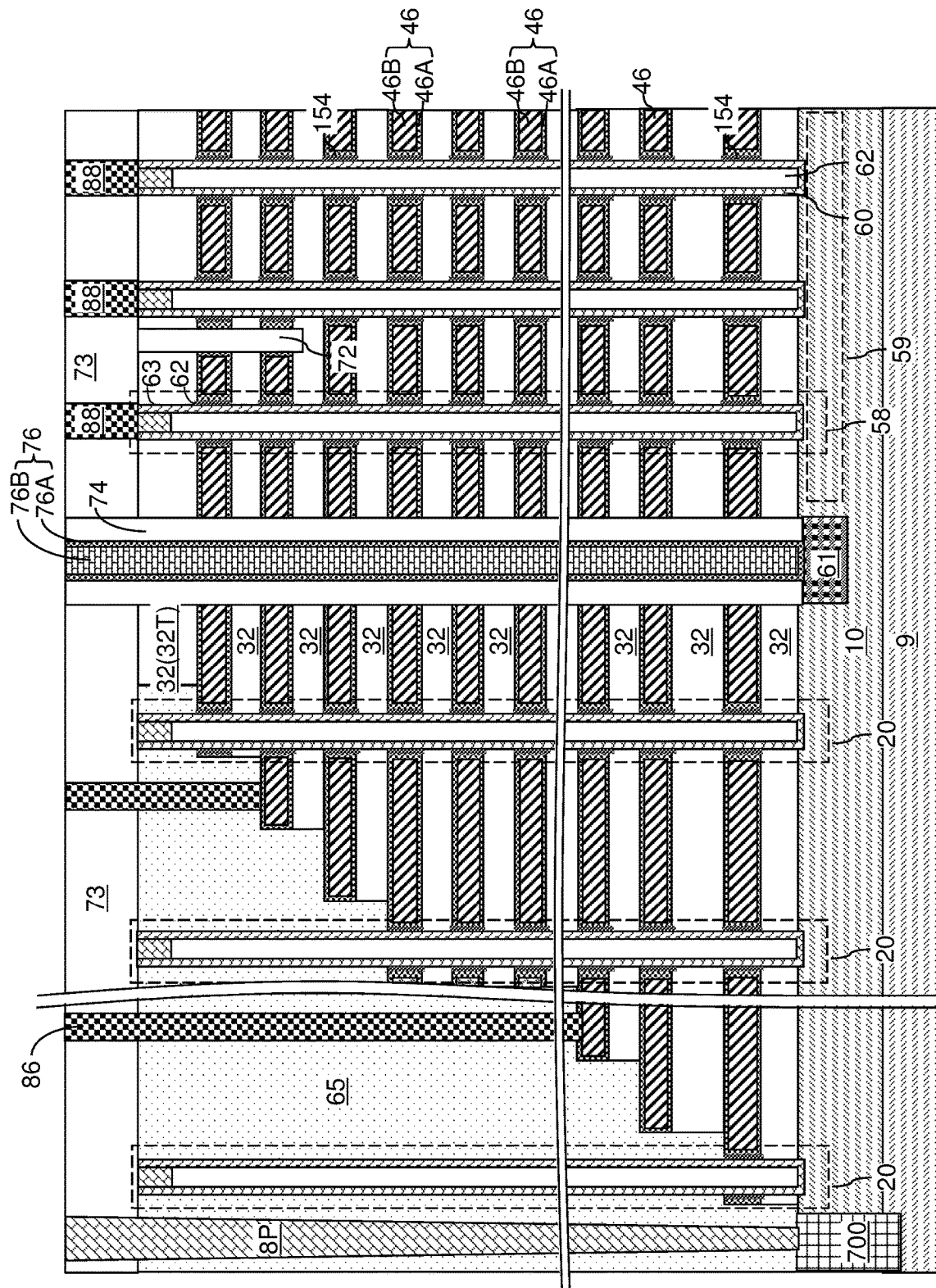
FIG. 27A is a vertical cross-sectional view of a first configuration of the second exemplary structure after formation of electrically conductive layers and various contact via structures according to the second embodiment of the present disclosure.
Figure 27B:
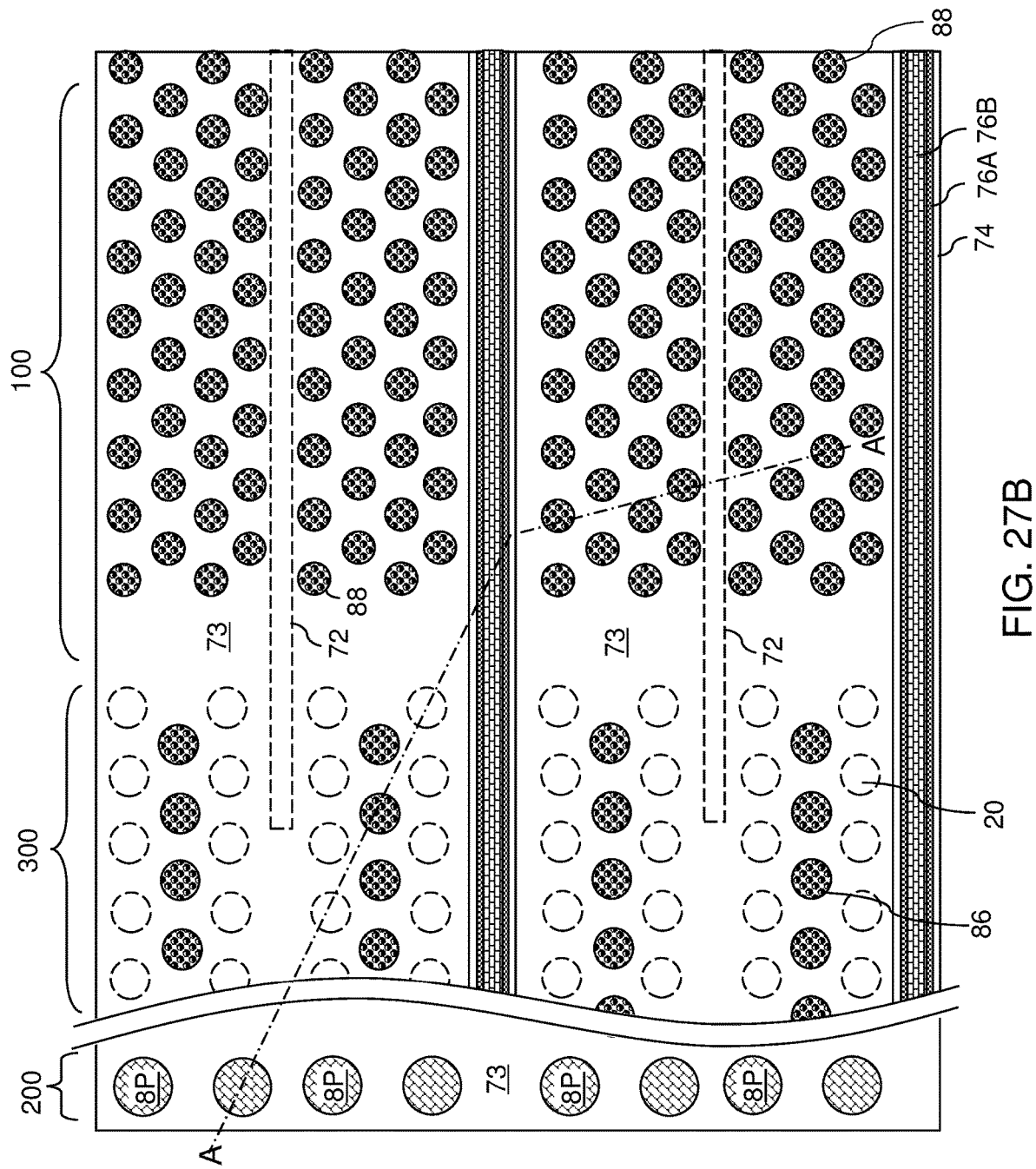
FIG. 27B is a top-down view of the first exemplary structure of FIG. 27A. The vertical plane A-A' is the plane of the schematic vertical cross-sectional view of FIG. 27A.

Referring to FIGS. 27A-27B, the processing steps described with reference to FIGS. 15A and 15B may be performed to remove the electrically conductive layers from inside the backside trenches 79 and from above the top surface of the contact-level dielectric layer 73. The processing steps described with reference to FIG. 16 may be performed to form an insulating spacer 74 and a backside contact via structure 76 within each backside trench 79. The processing steps described with reference to FIGS. 17A and 17B may be performed to form various contact via structures (88, 86, 8P). The contact via structures (88, 86, 8P) may comprise drain contact via structures 88 that are formed through the contact-level dielectric layer 73 directly on a respective one of the memory opening fill structures 58. The drain contact via structures 88 are electrically connected to an upper end of a respective vertical semiconductor channel 60.

According to various embodiments and drawings related to the first exemplary structure, a semiconductor memory device is provided, which comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a vertical semiconductor channel 60 and a vertical stack of discrete ferroelectric material portions 54 located at levels of the electrically conductive layers 46 and comprising a ferroelectric alloy material of a first dielectric metal oxide material and a second dielectric metal oxide material, and a vertical stack of discrete dielectric material portions comprising the first dielectric metal oxide material and vertically interlaced with the vertical stack of discrete ferroelectric material portions.

In one embodiment, each of the discrete ferroelectric material portions 54 comprises a respective outer sidewall that laterally protrudes outward by a greater lateral distance from a vertical axis VA passing through a geometrical center GC of the memory opening fill structure 58 than interfaces between the memory opening fill structure 58 and the insulating layers 32 laterally protrude from the vertical axis VA.

In one embodiment, each discrete dielectric material portion 53 within the vertical stack of discrete dielectric material portions 53 is in direct contact with a sidewall of a respective insulating layer 32 within the insulating layers 32. In one embodiment, each discrete dielectric material portion 53 has a first lateral thickness between a respective inner sidewall and a respective outer sidewall; each of the discrete ferroelectric material portions 54 has a second lateral thickness between a respective inner sidewall and the respective outer sidewall; and the second lateral thickness is greater than the first lateral thickness. In one embodiment, the inner sidewalls of the discrete dielectric material portions 53 and the inner sidewalls of the discrete ferroelectric material portions 54 are vertically coincident.

In one embodiment, each inner sidewall of the discrete ferroelectric material portions 54 comprises a respective first inner cylindrical sidewall; each outer sidewall of the discrete ferroelectric material portions 54 comprises a respective first outer cylindrical sidewall; each inner sidewall of the discrete dielectric material portions 53 comprises a respective second inner cylindrical sidewall; and each outer sidewall of the discrete dielectric material portions 53 comprises a respective second outer cylindrical sidewall.

In one embodiment, second dielectric metal oxide layers 44 comprising the second dielectric metal oxide material are interposed between vertically neighboring pairs of an insulating layer 32 of the insulating layers 32 and an electrically conductive layer 46 of the electrically conductive layers 46. In one embodiment, each of the second dielectric metal oxide layers 44 is in direct contact with an outer sidewall of a respective one of the discrete ferroelectric material portions 54.

In one embodiment, one of the second dielectric metal oxide layers 44 comprises: a first horizontally-extending portion 44A contacting a bottom surface of an overlying insulating layer 32 of the insulating layers 32; a second horizontally-extending portion 44B contacting a top surface of an underlying insulating layer 32 of the insulating layers 32; and a tubular portion 44C connecting the first horizontally-extending portion and the second horizontally-extending portion and laterally surrounding the memory opening fill structure 58.

In one embodiment, the cylindrical portion 44C has a uniform lateral thickness between an inner sidewall and an outer sidewall; the first horizontally-extending portion 44A and the second horizontally-extending portion 44B have a uniform vertical thickness; and the uniform lateral thickness is less than the uniform vertical thickness. In one embodiment, the electrically conductive layers 46 are in direct contact with an outer sidewall of a respective one of the discrete ferroelectric material portions 54.

In one embodiment, an entirety of the outer sidewall of each of the discrete ferroelectric material portions 54 is in direct contact with a cylindrical sidewall of a respective one of the electrically conductive layers 46.

In one embodiment, the vertical stack of discrete ferroelectric material portions 54 is in direct contact with cylindrical surface segments of the vertical semiconductor channel 60.

In one embodiment, the memory opening fill structure 58 further comprises an insulating barrier layer 56 located between the vertical stack of discrete ferroelectric material portions 54 and the vertical semiconductor channel 60.

In one embodiment, the discrete ferroelectric material portions 54 comprise hafnium zirconium oxide or aluminum doped hafnium oxide; and the discrete dielectric material portions 53 consist essentially of hafnium oxide.

According to various embodiments and drawings related to the second exemplary structure and the third exemplary structure, a semiconductor memory device is provided, which comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a vertical stack of discrete non-stoichiometric oxygen-deficient ferroelectric material portions 154 and a vertical semiconductor channel 60. The discrete non-stoichiometric oxygen-deficient ferroelectric material portions 154 are vertically spaced apart from each other; and each of the discrete non-stoichiometric oxygen-deficient ferroelectric material portions 154 is in direct contact with a sidewall of a respective oxygen-gettering liner 46A.

In one embodiment, each of the electrically conductive layers 46 comprises the respective oxygen-gettering liner 46A comprising a first conductive material and conductive fill material layer 46B comprising a second conductive material that is different from the first conductive material.

In one embodiment, the first conductive material comprises TaN or TiN. In another embodiment, the first conductive material comprises an elemental metal that is selected from platinum, titanium, tantalum, hafnium, or aluminum.

In one embodiment, the oxygen-gettering liner 46A of each of the electrically conductive layers 46 is in direct contact with a respective pair of insulating layers 32 of the insulating layers of the alternating stack.

In one embodiment, each of the discrete non-stoichiometric oxygen-deficient ferroelectric material portions 154 has a radial oxygen concentration gradient such that an atomic percentage of oxygen atoms decreases with a radial distance from a vertical axis VA passing through a geometrical center GC of the memory opening fill structure 58.

In one embodiment, the memory opening fill structure 58 further comprises a vertical stack of discrete spacer material portions 155 that is interlaced with the vertical stack of discrete non-stoichiometric oxygen-deficient ferroelectric material portions 154 along a vertical direction. In one embodiment, the discrete spacer material portions 155 comprise a ferroelectric material having a material composition that differs from a material composition of the discrete non-stoichiometric oxygen-deficient ferroelectric material portions 154 by a reduced density of oxygen vacancies.

In one embodiment, outer sidewalls of the vertical stack of discrete spacer material portions 155 are vertically coincident with outer sidewalls of the vertical stack of discrete non-stoichiometric oxygen-deficient ferroelectric material portions 154; and inner sidewalls of the vertical stack of discrete spacer material portions 155 are vertically coincident with inner sidewalls of the vertical stack of discrete non-stoichiometric oxygen-deficient ferroelectric material portions 154.

In one embodiment, each of the discrete non-stoichiometric oxygen-deficient ferroelectric material portions 154 comprises: a respective top surface that contacts a bottom surface of a respective overlying insulating layer 32 of the insulating layers 32; and a respective bottom surface that contacts a top surface of a respective underlying insulating layer 32 of the insulating layers 32. In one embodiment, the vertical semiconductor channel 60 is in direct contact with sidewalls of the insulating layers 32 within the alternating stack (32, 46).

In one embodiment, the discrete non-stoichiometric oxygen-deficient ferroelectric material portions 154 have a formula selected from $HfO_{2-x}$, $ZrO_{2-x}$, or $AlO_{1.5-x}$, where $x>0$.

The various embodiments of the present disclosure may be employed to provide ferroelectric memory devices including ferroelectric material portions that provide superior ferroelectric characteristics and/or are formed using a simpler process than the prior art devices. The various embodiments of the present disclosure may be employed to enhance performance of ferroelectric memory devices, to increase the process yield of the ferroelectric memory devices, and/or to reduce the process complexity and turn-around time during manufacturing.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor memory device, comprising:
    an alternating stack of insulating layers and electrically conductive layers;
    a memory opening vertically extending through the alternating stack; and
    a memory opening fill structure located in the memory opening and comprising a vertical stack of discrete non-stoichiometric oxygen-deficient ferroelectric material portions and a vertical semiconductor channel,
    wherein:
    the discrete non-stoichiometric oxygen-deficient ferroelectric material portions are vertically spaced apart from each other;
    each of the discrete non-stoichiometric oxygen-deficient ferroelectric material portions is in direct contact with a sidewall of a respective oxygen-gettering liner; and
    the discrete non-stoichiometric oxygen-deficient ferroelectric material portions have a formula selected from:
    $HfO_{2-x}$, where $x > 0$, or
    $ZrO_{2-y}$, where $y > 0$, or
    $AlO_{1.5-z}$, where $z > 0$.

2. The semiconductor memory device of claim 1, wherein each of the electrically conductive layers comprises the respective oxygen-gettering liner comprising a first conductive material and conductive fill material layer comprising a second conductive material that is different from the first conductive material.

3. The semiconductor memory device of claim 2, wherein the first conductive material comprises TaN or TiN.

4. The semiconductor memory device of claim 2, wherein the first conductive material comprises an elemental metal that is selected from platinum, titanium, tantalum, hafnium, or aluminum.

5. The semiconductor memory device of claim 2, wherein the oxygen-gettering liner of each of the electrically conductive layers is in direct contact with a respective pair of insulating layers of the insulating layers of the alternating stack.

6. The semiconductor memory device of claim 1, wherein each of the discrete non-stoichiometric oxygen-deficient ferroelectric material portions has a radial oxygen concentration gradient such that an atomic percentage of oxygen atoms decreases with a radial distance from a vertical axis passing through a geometrical center of the memory opening fill structure.

7. The semiconductor memory device of claim 1, wherein the memory opening fill structure further comprises a vertical stack of discrete spacer material portions that is interlaced with the vertical stack of discrete non-stoichiometric oxygen-deficient ferroelectric material portions along a vertical direction.

8. The semiconductor memory device of claim 7, wherein the discrete spacer material portions comprise a ferroelectric material having a material composition that differs from a material composition of the discrete non-stoichiometric oxygen-deficient ferroelectric material portions by a reduced density of oxygen vacancies.

9. The semiconductor memory device of claim 7, wherein:
outer sidewalls of the vertical stack of discrete spacer material portions are vertically coincident with outer sidewalls of the vertical stack of discrete non-stoichiometric oxygen-deficient ferroelectric material portions; and
inner sidewalls of the vertical stack of discrete spacer material portions are vertically coincident with inner sidewalls of the vertical stack of discrete non-stoichiometric oxygen-deficient ferroelectric material portions.

10. The semiconductor memory device of claim 1, wherein:
the vertical semiconductor channel is in direct contact with sidewalls of the insulating layers within the alternating stack; and
each of the discrete non-stoichiometric oxygen-deficient ferroelectric material portions comprises a respective top surface that contacts a bottom surface of a respective overlying insulating layer of the insulating layers, and a respective bottom surface that contacts a top surface of a respective underlying insulating layer of the insulating layers.

11. The semiconductor memory device of claim 1, wherein the discrete non-stoichiometric oxygen-deficient ferroelectric material portions have the formula $HfO_{2-x}$, where x>0.

12. The semiconductor memory device of claim 1, wherein the discrete non-stoichiometric oxygen-deficient ferroelectric material portions have the formula $ZrO_{2-y}$, where y >0.

13. The semiconductor memory device of claim 1, wherein the discrete non-stoichiometric oxygen-deficient ferroelectric material portions have the formula $AlO_{1.5-z}$, where z>0.

14. A method of forming a semiconductor structure, comprising:
forming an alternating stack of insulating layers and sacrificial material layers over a substrate;
forming a memory opening through the alternating stack;
forming an in-process memory opening fill structure in the memory opening, wherein the in-process memory opening fill structure comprises metal oxide tubular portions located at levels of the sacrificial material layers and a vertical semiconductor channel that is formed over the metal oxide tubular portions;
forming backside recesses by removing the sacrificial material layers selective to the insulating layers and the metal oxide tubular portions;
forming an oxygen-gettering liner in each of the backside recesses and directly on an outer sidewall of a respective one of the metal oxide tubular portions; and
gettering oxygen atoms from the metal oxide tubular portions to convert them into a vertical stack of discrete non-stoichiometric oxygen-deficient ferroelectric material portions;
wherein:
the oxygen-gettering liner comprises platinum, titanium, tantalum, hafnium, aluminum, TaN or TiN;
the metal oxide tubular portions comprise stoichiometric hafnium oxide, stoichiometric zirconium oxide or stoichiometric aluminum oxide; and
the discrete non-stoichiometric oxygen-deficient ferroelectric material portions have a formula selected from $HfO_{2-x}$, $ZrO_{2-x}$, or $AlO_{1.5-x}$, where x >0.

15. The method of claim 14, further comprising forming a conductive fill material layer comprising a second conductive material on the oxygen-gettering liners in each remaining volume of the backside recesses to form word lines, wherein the oxygen-gettering liners comprise a conductive material.

16. The method of claim 14, further comprising forming a metal oxide layer on a sidewall of the memory opening, wherein the metal oxide tubular portions comprise portions of the metal oxide layer that are located at the levels of the sacrificial material layers.

17. The method of claim 16, wherein:
portions the metal oxide layer located at levels of the insulating layers comprise ferroelectric dielectric spacer material portions after formation of the vertical stack of discrete non-stoichiometric oxygen-deficient ferroelectric material portions;
the discrete spacer material portions have a first average density of oxygen vacancies; and
the discrete non-stoichiometric oxygen-deficient ferroelectric material portions have a second average density of oxygen vacancies which is greater than the first average density.

18. The method of claim 14, further comprising:
laterally recessing sidewalls of the sacrificial material layers around the memory opening to form annular recesses at levels of the sacrificial material layers around the memory opening;
conformally depositing a metal oxide layer the annular recesses; and
removing portions of the metal oxide layer located outside the annular recesses by anisotropically etching the metal oxide layer to leave the metal oxide tubular portions in the annular recesses.

19. The method of claim 18, wherein the vertical semiconductor channel is formed by depositing a semiconductor channel material directly on inner sidewalls of the metal oxide tubular portions and directly on sidewalls of the insulating layers around the memory opening.

20. A method of forming a semiconductor structure, comprising:
- forming an alternating stack of insulating layers and sacrificial material layers over a substrate;
- forming a memory opening through the alternating stack;
- forming an in-process memory opening fill structure in the memory opening, wherein the in-process memory opening fill structure comprises metal oxide tubular portions located at levels of the sacrificial material layers and a vertical semiconductor channel that is formed over the metal oxide tubular portions;
- forming backside recesses by removing the sacrificial material layers selective to the insulating layers and the metal oxide tubular portions;
- forming an oxygen-gettering liner in each of the backside recesses and directly on an outer sidewall of a respective one of the metal oxide tubular portions;
- gettering oxygen atoms from the metal oxide tubular portions to convert them into a vertical stack of discrete non-stoichiometric oxygen-deficient ferroelectric material portions; and
- forming a metal oxide layer on a sidewall of the memory opening, wherein the metal oxide tubular portions comprise portions of the metal oxide layer that are located at the levels of the sacrificial material layers;

wherein:
- portions the metal oxide layer located at levels of the insulating layers comprise ferroelectric dielectric spacer material portions after formation of the vertical stack of discrete non-stoichiometric oxygen-deficient ferroelectric material portions;
- the discrete spacer material portions have a first average density of oxygen vacancies; and
- the discrete non-stoichiometric oxygen-deficient ferroelectric material portions have a second average density of oxygen vacancies which is greater than the first average density.

21. A semiconductor memory device, comprising:
- an alternating stack of insulating layers and electrically conductive layers;
- a memory opening vertically extending through the alternating stack; and
- a memory opening fill structure located in the memory opening and comprising a vertical stack of discrete non-stoichiometric oxygen-deficient ferroelectric material portions and a vertical semiconductor channel, wherein:
- the discrete non-stoichiometric oxygen-deficient ferroelectric material portions are vertically spaced apart from each other;
- each of the discrete non-stoichiometric oxygen-deficient ferroelectric material portions is in direct contact with a sidewall of a respective oxygen-gettering liner; and
- each of the discrete non-stoichiometric oxygen-deficient ferroelectric material portions has a radial oxygen concentration gradient such that an atomic percentage of oxygen atoms decreases with a radial distance from a vertical axis passing through a geometrical center of the memory opening fill structure.

22. A semiconductor memory device, comprising:
- an alternating stack of insulating layers and electrically conductive layers;
- a memory opening vertically extending through the alternating stack; and
- a memory opening fill structure located in the memory opening and comprising a vertical stack of discrete non-stoichiometric oxygen-deficient ferroelectric material portions and a vertical semiconductor channel, wherein:
- the discrete non-stoichiometric oxygen-deficient ferroelectric material portions are vertically spaced apart from each other;
- each of the discrete non-stoichiometric oxygen-deficient ferroelectric material portions is in direct contact with a sidewall of a respective oxygen-gettering liner;
- the memory opening fill structure further comprises a vertical stack of discrete spacer material portions that is interlaced with the vertical stack of discrete non-stoichiometric oxygen-deficient ferroelectric material portions along a vertical direction;
- outer sidewalls of the vertical stack of discrete spacer material portions are vertically coincident with outer sidewalls of the vertical stack of discrete non-stoichiometric oxygen-deficient ferroelectric material portions; and
- inner sidewalls of the vertical stack of discrete spacer material portions are vertically coincident with inner sidewalls of the vertical stack of discrete non-stoichiometric oxygen-deficient ferroelectric material portions.

* * * * *